United States Patent
Frougier et al.

(10) Patent No.: US 12,094,972 B2
(45) Date of Patent: Sep. 17, 2024

(54) GATE-ALL-AROUND FIELD EFFECT TRANSISTORS HAVING END PORTIONS OF NANOSHEET CHANNEL LAYERS ADJACENT TO SOURCE/DRAIN REGIONS BEING WIDER THAN THE CENTER PORTIONS

(71) Applicant: GLOBALFOUNDRIES U.S. Inc., Malta, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 977 days.

(21) Appl. No.: 16/406,071

(22) Filed: May 8, 2019

(65) Prior Publication Data
US 2020/0357911 A1 Nov. 12, 2020

(51) Int. Cl.
*H01L 29/78* (2006.01)
*H01L 29/06* (2006.01)
(Continued)

(52) U.S. Cl.
CPC ........ *H01L 29/785* (2013.01); *H01L 29/0649* (2013.01); *H01L 29/0673* (2013.01);
(Continued)

(58) Field of Classification Search
CPC ......... H01L 29/42392; H01L 29/66545; H01L 29/78696
See application file for complete search history.

(56) References Cited

U.S. PATENT DOCUMENTS 7,839,605 B2    11/2010   Parker
8,421,890 B2    4/2013    Benkley, III
(Continued)

FOREIGN PATENT DOCUMENTS

WO    2018203170 A1    11/2018

OTHER PUBLICATIONS

Loubet et al., "Stacked Nanosheet Gate-All-Around Transistor to Enable Scaling Beyond FinFET," Symposium on VLSI Technology Digest of Technical Papers, 2017, pp. T230-T231.
(Continued)

*Primary Examiner* — Anh D Mai
(74) *Attorney, Agent, or Firm* — Francois Pagette; Hoffman Warnick LLC

(57) ABSTRACT

Disclosed are a gate-all-around field effect transistor (GAAFET) and method. The GAAFET includes stacked nanosheets having end portions adjacent to source/drain regions and a center portion between the end portions. The thickness of each nanosheet is tapered from a maximum thickness near the source/drain regions to a minimum thickness near and across the center portion. A gate wraps around each center portion. Inner spacers are aligned below the end portions between the gate and source/drain regions. The thickness of each inner spacer is tapered from a maximum thickness at the gate to a minimum thickness near the adjacent source/drain region. Each inner spacer includes a first spacer layer immediately adjacent to the gate, a second spacer layer immediately adjacent to the gate at least above the first spacer layer and further extending laterally beyond the first spacer layer toward or to the adjacent source/drain region, and, optionally, an air-gap.

14 Claims, 27 Drawing Sheets

(51) Int. Cl.
*H01L 29/165* (2006.01)
*H01L 29/66* (2006.01)

(52) U.S. Cl.
CPC ........ *H01L 29/165* (2013.01); *H01L 29/6653* (2013.01); *H01L 29/66545* (2013.01); *H01L 29/66553* (2013.01); *H01L 29/6656* (2013.01); *H01L 29/66795* (2013.01)

(56) References Cited

U.S. PATENT DOCUMENTS

| | | | |
|---|---|---|---|
| 9,029,834 B2 * | 5/2015 | Bangsaruntip | H01L 29/165 257/24 |
| 9,064,943 B1 | 6/2015 | Anderson et al. | |
| 9,508,796 B2 | 11/2016 | Kim et al. | |
| 9,508,829 B1 | 11/2016 | Cheng et al. | |
| 9,691,850 B2 | 6/2017 | Cheng et al. | |
| 9,716,158 B1 | 7/2017 | Cheng et al. | |
| 9,881,998 B1 | 1/2018 | Cheng et al. | |
| 9,923,055 B1 | 3/2018 | Cheng et al. | |
| 9,941,352 B1 | 4/2018 | Bi et al. | |
| 10,014,390 B1 * | 7/2018 | Bouche | H01L 29/42376 |
| 10,170,584 B2 | 1/2019 | Guillorn et al. | |
| 10,211,307 B2 | 2/2019 | Ching et al. | |
| 10,269,983 B2 | 4/2019 | Frougier et al. | |
| 10,818,559 B1 * | 10/2020 | Cheng | H01L 29/6653 |
| 10,943,989 B2 * | 3/2021 | Wu | H01L 29/165 |
| 2016/0190312 A1 | 6/2016 | Zhang et al. | |
| 2016/0293668 A1 * | 10/2016 | Cao | H01L 51/0558 |
| 2018/0047834 A1 | 2/2018 | Chao et al. | |
| 2018/0240664 A9 | 8/2018 | Varadarajan et al. | |
| 2018/0277656 A1 | 9/2018 | Chao et al. | |
| 2018/0331232 A1 | 11/2018 | Frougier et al. | |
| 2019/0058052 A1 | 2/2019 | Frougier et al. | |
| 2019/0237559 A1 | 8/2019 | Cheng et al. | |
| 2020/0321434 A1 * | 10/2020 | Cheng | H01L 29/0673 |

OTHER PUBLICATIONS

Disclosed Anonymously, "Inner Spacer Formation Using a Deposition-Etch Technique for Beyond-7nm Nanosheet CPP Scaling", www.IP.com, IPCOM000253603D, Apr. 16, 2018, pp. 1-8.
Disclosed Anonymously, "Dual Stage Inner Spacer Formation for Nanpsheet-FET," IPCOM000253328D, www.ip.com, Mar. 22, 2018, pp. 1-6.

* cited by examiner

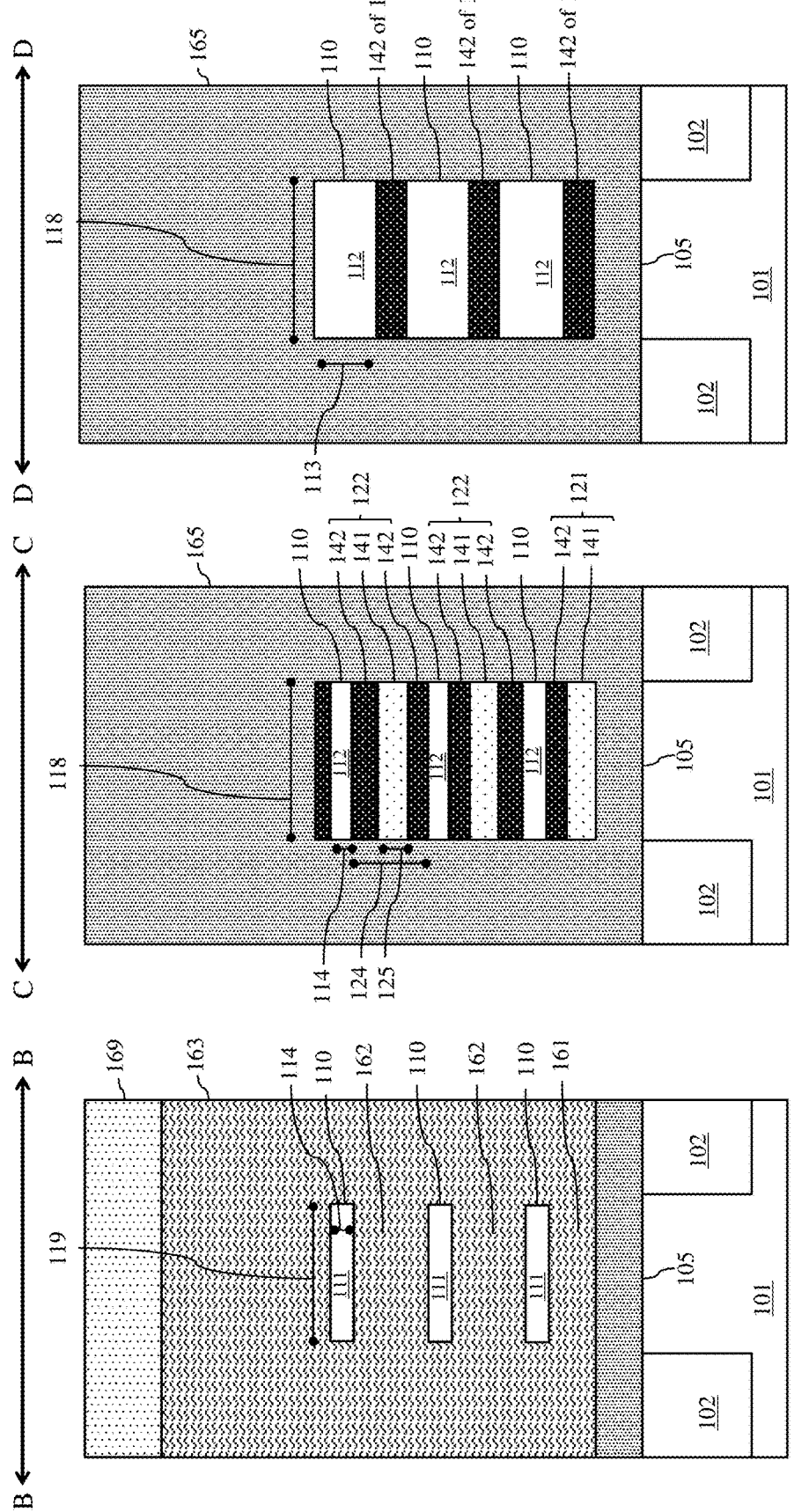

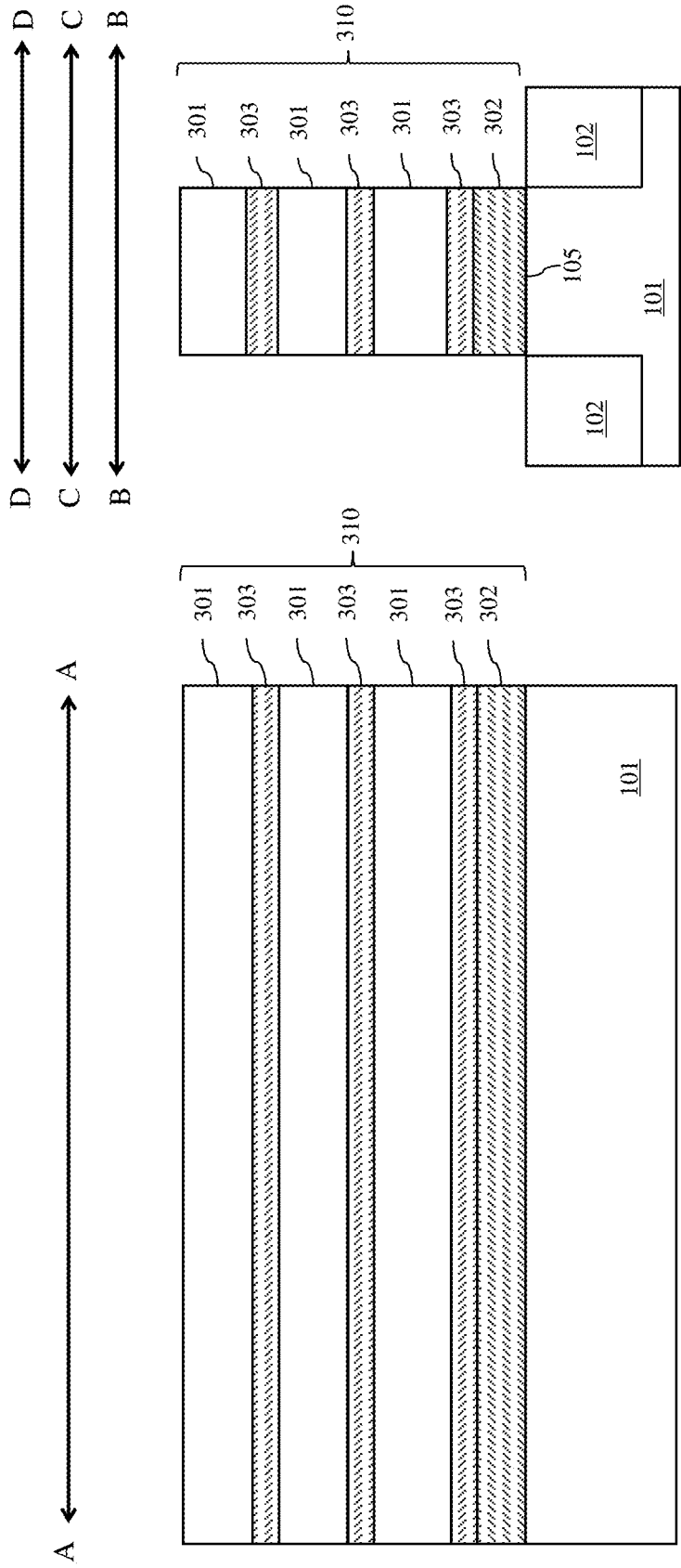

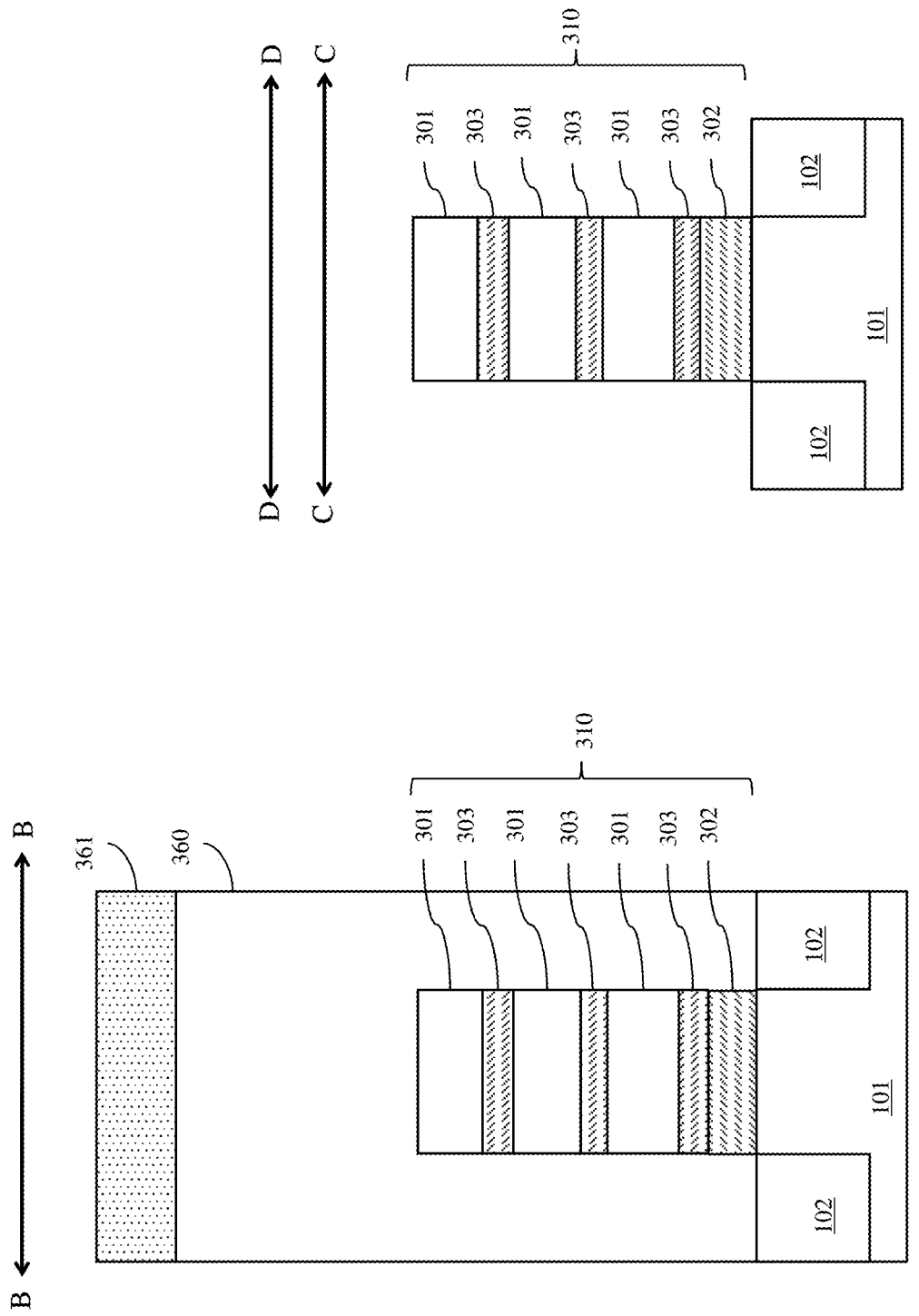

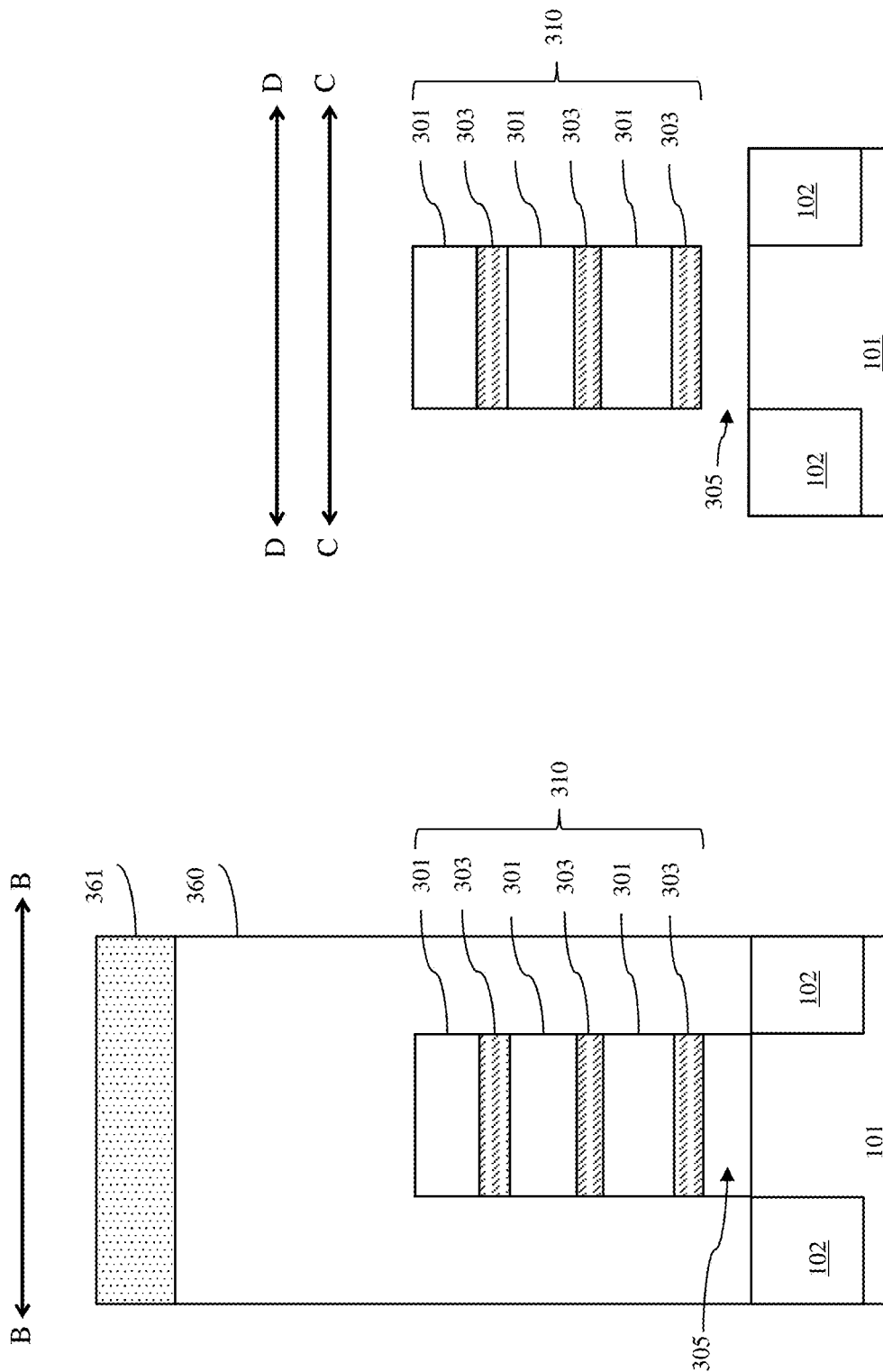

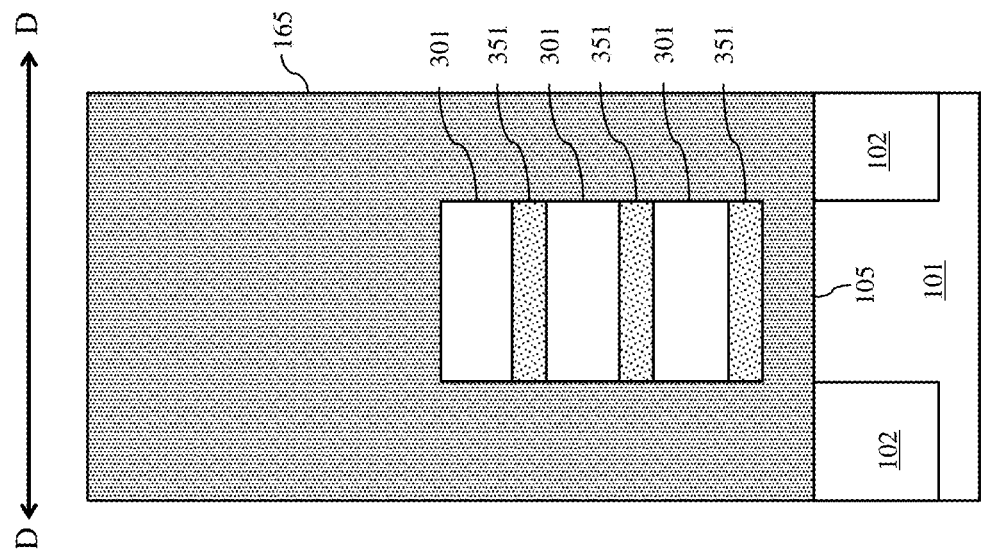
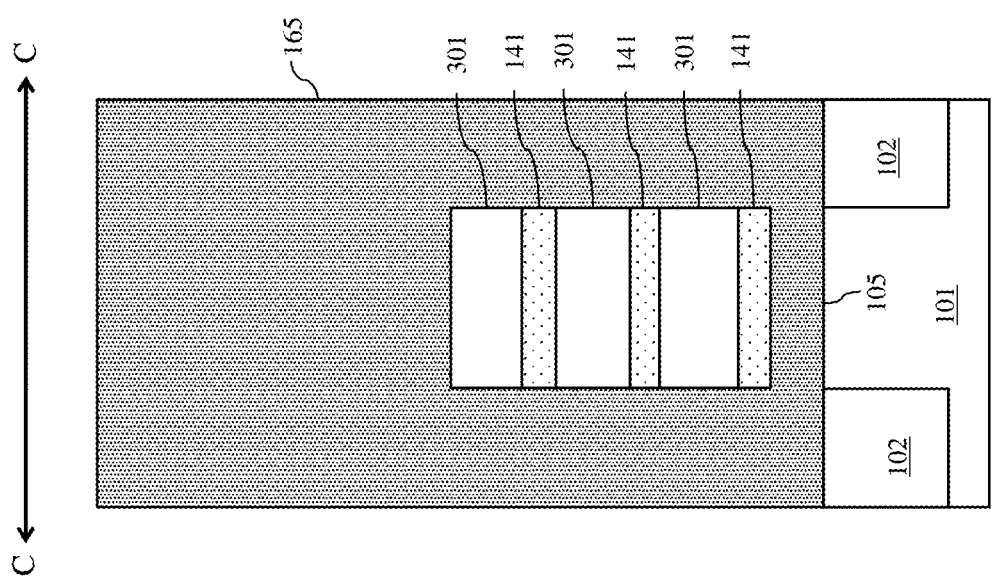

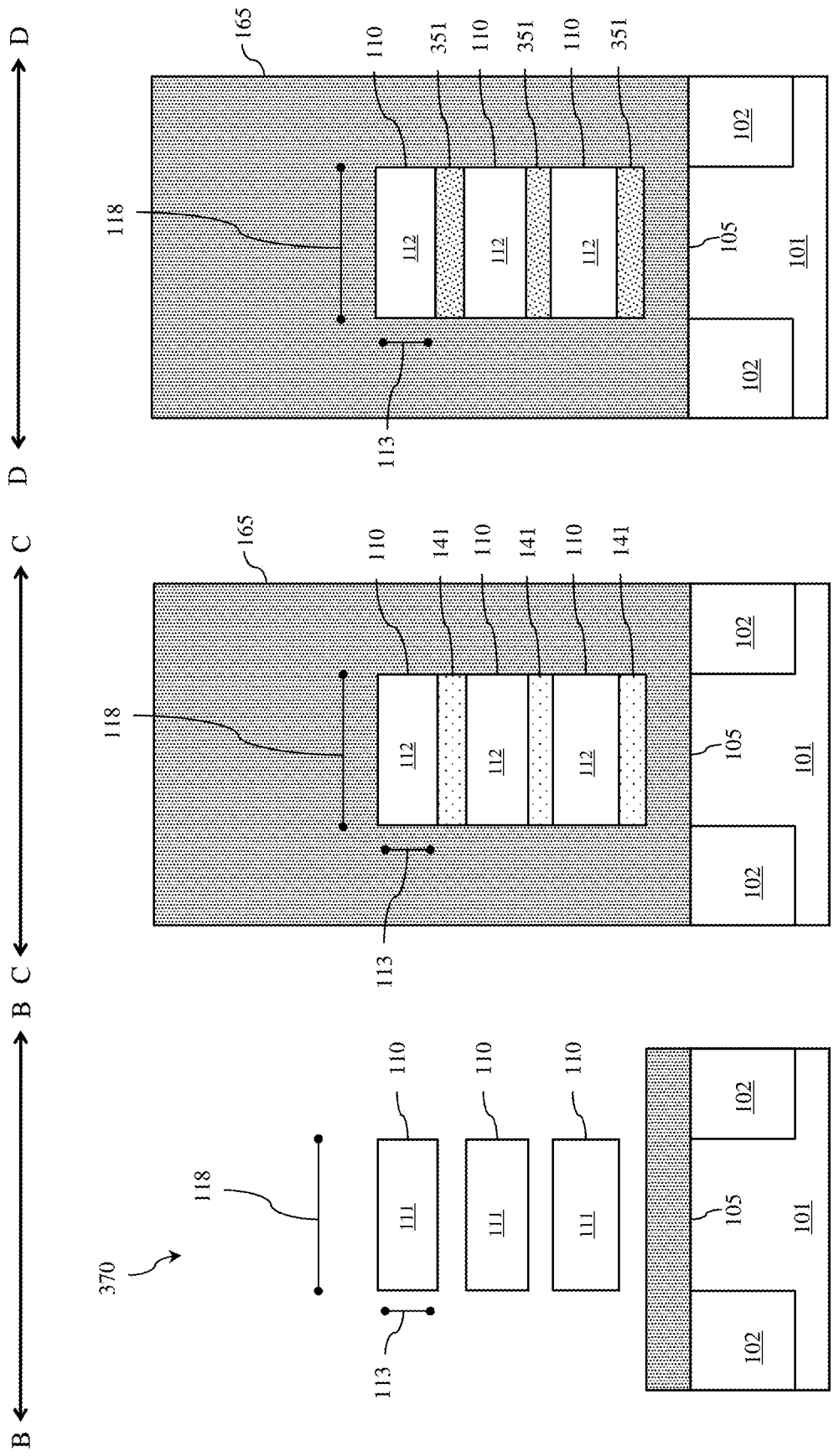

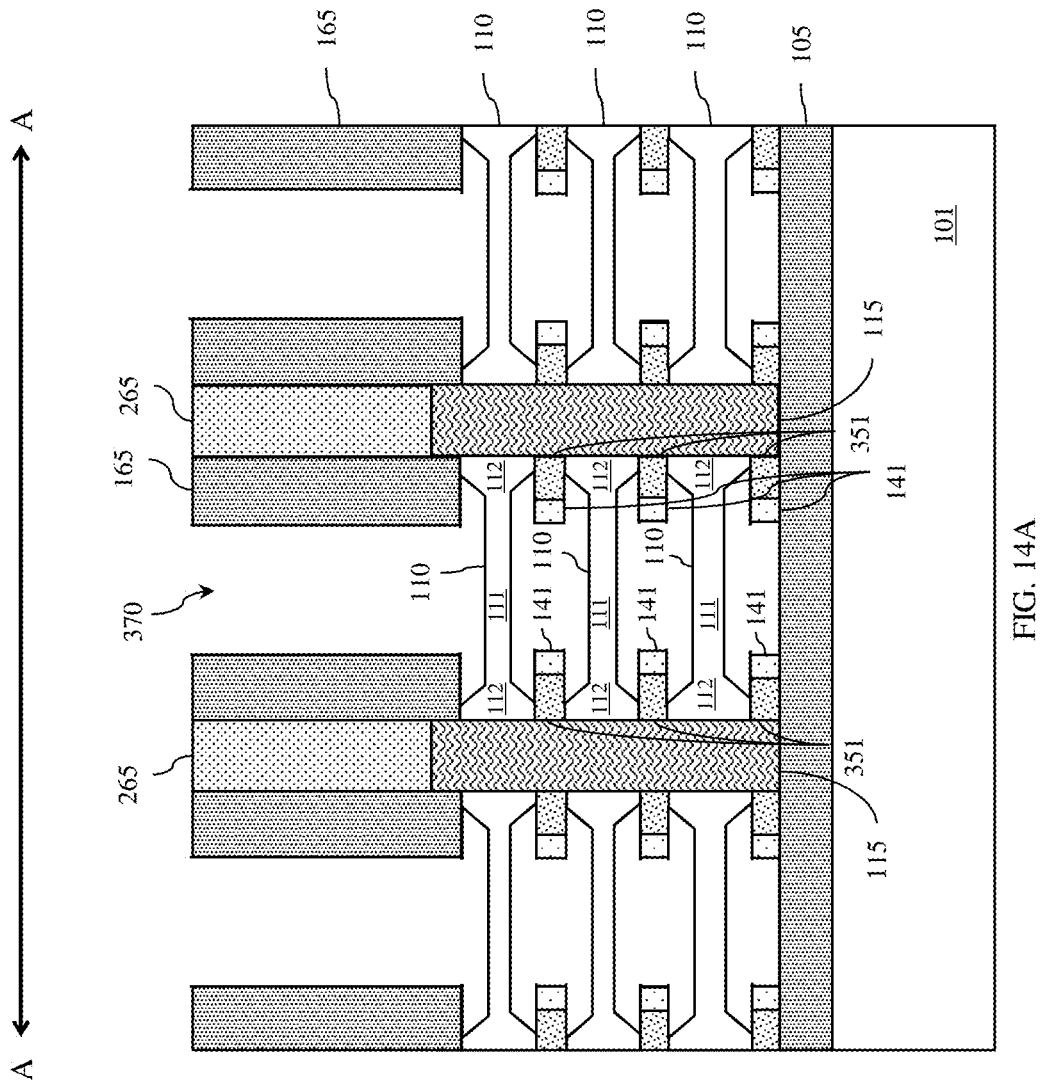

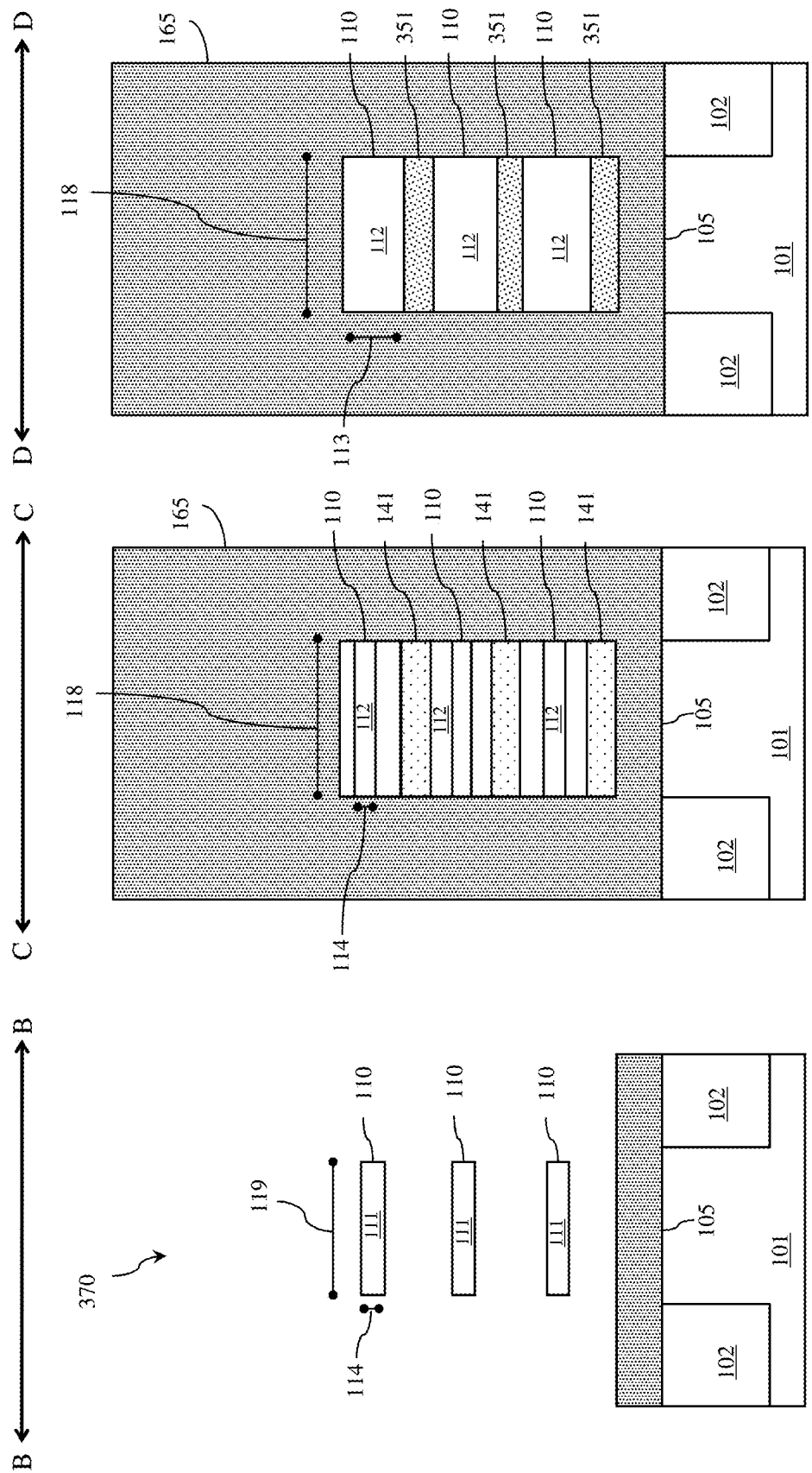

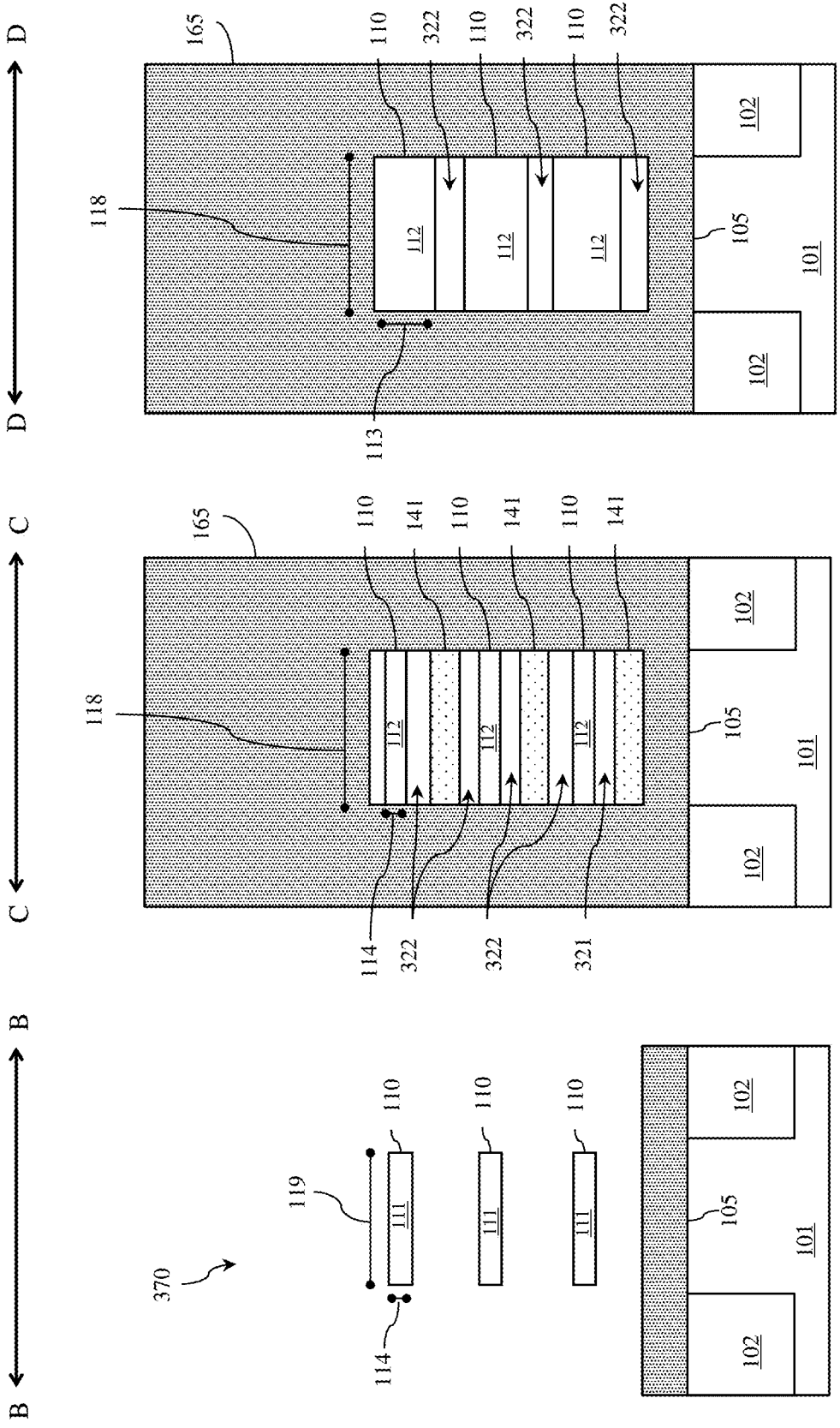

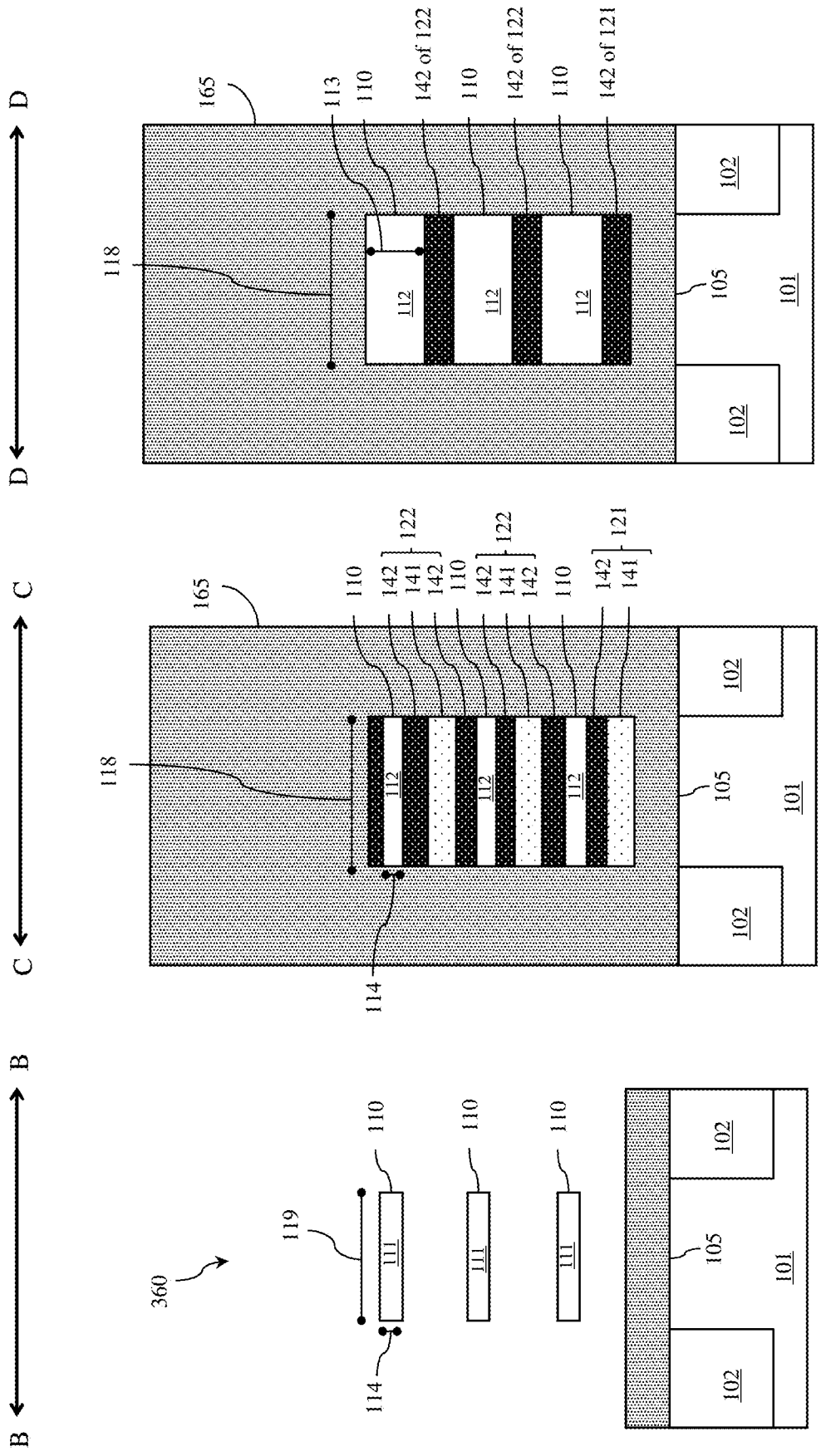

GATE-ALL-AROUND FIELD EFFECT TRANSISTORS HAVING END PORTIONS OF NANOSHEET CHANNEL LAYERS ADJACENT TO SOURCE/DRAIN REGIONS BEING WIDER THAN THE CENTER PORTIONS

BACKGROUND

Field of the Invention

The present invention relates to gate-all-around field effect transistors (GAAFETs) and, more particularly, to nanosheet-type GAAFETs with robust inner spacers and methods of forming the GAAFETs.

Description of Related Art

Integrated circuit (IC) design decisions are often driven by device performance, scalability, and manufacturability. For example, recently, to improve device drive current and electrostatics and to allow for further device size scaling, gate-all-around field effect transistors (GAAFETs) and, particularly, nanosheet-type GAAFETs were developed. A nanosheet-type GAAFET is a type of FET that includes source/drain regions and semiconductor nanosheets that extend laterally between the source/drain regions. The nanosheets are stacked vertically (i.e., one above the other) and are physically separated from each other. A gate wraps around the center portion of each of the nanosheets (i.e., is adjacent to the top, bottom and opposing sides of the center portions of each of the nanosheets), thereby defining channel regions within the nanosheets. Dielectric spacers provide electrical isolation between the gate and the adjacent source/drain regions. As with other types of FETs (e.g., planar FETs and fin-type FETs (FINFETs)), the dielectric spacers in a GAAFET include dielectric gate sidewall spacers that are positioned laterally immediately adjacent to the external sidewalls of the gate. Additionally, the dielectric spacers in a GAAFET include dielectric inner spacers, which are positioned laterally between the sidewalls of internal portions of the gate (i.e., the portions of the gate below each channel region) and the adjacent source/drain regions. Unfortunately, with device size scaling, it has become challenging to form robust inner spacers for a GAAFET using conventional processing techniques.

SUMMARY

Disclosed herein are embodiments of a nanosheet-type gate-all-around field effect transistor (GAAFET). The GAAFET can include source/drain regions and semiconductor nanosheets, which extend laterally between the source/drain regions. The nanosheets can be stacked vertically and can be physically separated from each other. Each nanosheet can include end portions (including source/drain extension regions) immediately adjacent to the source/drain regions, respectively, and a center portion (including a channel region) positioned laterally between the end portions. The GAAFET can further include a gate wrapped around the center portion of each nanosheet such that internal portions of the gate are aligned below the nanosheets, respectively. The GAAFET can further include inner spacers. Each inner spacer can be aligned below an end portion of a nanosheet such that it is positioned laterally between an internal portion of the gate and an adjacent source/drain region. Each inner spacer can include a first spacer layer, which is positioned laterally immediately adjacent to the internal portion of the gate. Each inner spacer can further include a second spacer layer, which is also immediately adjacent to the internal portion of the gate at least above the first spacer layer and which further extends laterally beyond the first spacer layer toward or to the adjacent source/drain region.

One specific embodiment of the GAAFET can include air-gap inner spacers. Specifically, like the embodiments mentioned above, this GAAFET can include source/drain regions and semiconductor nanosheets, which extend laterally between the source/drain regions. The nanosheets can be stacked vertically and can be physically separated from each other. Each nanosheet can include end portions (including source/drain extension regions) immediately adjacent to the source/drain regions, respectively, and a center portion (including a channel region) positioned laterally between the end portions. The GAAFET can further include a gate wrapped around the center portion of each nanosheet such that internal portions of the gate are aligned below the nanosheets, respectively. The GAAFET can further include inner spacers. Each inner spacer can be aligned below an end portion of a nanosheet so that it is positioned laterally between an internal portion of the gate and an adjacent source/drain region. Each inner spacer can include a first spacer layer, which is positioned laterally immediately adjacent to the internal portion of the gate. Each inner spacer can further include a second spacer layer, which is also immediately adjacent to the internal portion of the gate at least above the first spacer layer and which further extends laterally beyond the first spacer layer toward or to the adjacent source/drain region. Each inner spacer can further include an air-gap, which is positioned laterally between the first spacer layer and the adjacent source/drain region. Thus, each inner spacer can be an air-gap inner spacer.

Also disclosed herein are embodiments of a method for forming a nanosheet-type gate-all-around field effect transistor (GAAFET) with robust inner spacers.

The method can include forming a partially completed GAAFET structure that includes source/drain regions and semiconductor nanosheets, which extend laterally between the source/drain regions. The nanosheets can be stacked vertically and can be physically separated from each other. Each nanosheet can include end portions (including source/drain extension regions) immediately adjacent to the source/drain regions, respectively, and a center portion (including a channel region) positioned laterally between the end portions. Center portions of the nanosheets can be exposed within a gate opening. Temporary spacers can be aligned below the end portions of each of the nanosheets. Each temporary spacer can include a first spacer layer adjacent to the gate opening and a sacrificial spacer layer positioned laterally between the first spacer layer and an adjacent source/drain region. At this point in the processing, the nanosheets will have an essentially uniform thickness.

The method can further include, before forming a gate in the gate opening such that it wraps around the center portions of the nanosheets, thinning the nanosheets in order to expose the sacrificial spacer layers of the temporary spacers. The sacrificial spacer layers can then be removed, thereby forming inner spacer cavities. Each inner spacer cavity will have a closed distal end defined by a source/drain region surface and an open proximal end, which is adjacent to the gate opening and which is opposite the closed distal end. It should be noted that the first spacer layers of the temporary spacers will remain intact during removal of the sacrificial spacer layers such that they traverse the open proximal ends of the inner spacer cavities, respectively.

The method can further include conformally depositing a dielectric spacer material into the gate opening and further into the inner spacer cavities through the open proximal ends. This dielectric spacer material can then be selectively and isotropically etched in order to expose the center portions of the nanosheets without removing the dielectric spacer material from the inner spacer cavities. The deposition and etch of the dielectric spacer material can specifically be formed so as to leave a second spacer layer (i.e., a remaining portion of the dielectric spacer material) within each inner spacer cavity and closing off the proximal end adjacent to the gate opening, thereby forming inner spacers in the inner spacer cavities. In the resulting inner spacers, the second spacer layer will at least be above the first spacer layer and will further extend laterally beyond the first spacer layer toward or to the source/drain region surface at the closed distal end of the cavity. Following formation of the inner spacers, additional processing can be performed to complete the GAAFET structure.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1A-1D and 1E are different cross-section diagrams and a top view diagram, respectively, of a semiconductor structure formed according to the flow diagram of FIG. 2 and including an embodiment of a nanosheet-type gate-all-around field effect transistor (GAAFET) with robust inner spacers;

FIGS. 3A-3B are different cross-section diagrams illustrating a partially completed structure formed according to the flow diagram of FIG. 2;

FIGS. 4A-4C are different cross-section diagrams illustrating a partially completed structure formed according to the flow diagram of FIG. 2;

FIGS. 5A-5C are different cross-section diagrams illustrating a partially completed structure formed according to the flow diagram of FIG. 2;

FIGS. 10A-10C are different cross-section diagrams illustrating a partially completed structure formed according to the flow diagram of FIG. 2;

FIGS. 13A-13D are different cross-section diagrams illustrating a partially completed structure formed according to the flow diagram of FIG. 2;

FIGS. 14A-14D are different cross-section diagrams illustrating a partially completed structure formed according to the flow diagram of FIG. 2;

FIGS. 15A-15D are different cross-section diagrams illustrating a partially completed structure formed according to the flow diagram of FIG. 2; and FIGS. 16A-16D are different cross-section diagrams illustrating a partially completed structure formed according to the flow diagram of FIG. 2.

DETAILED DESCRIPTION

Figure 1A:
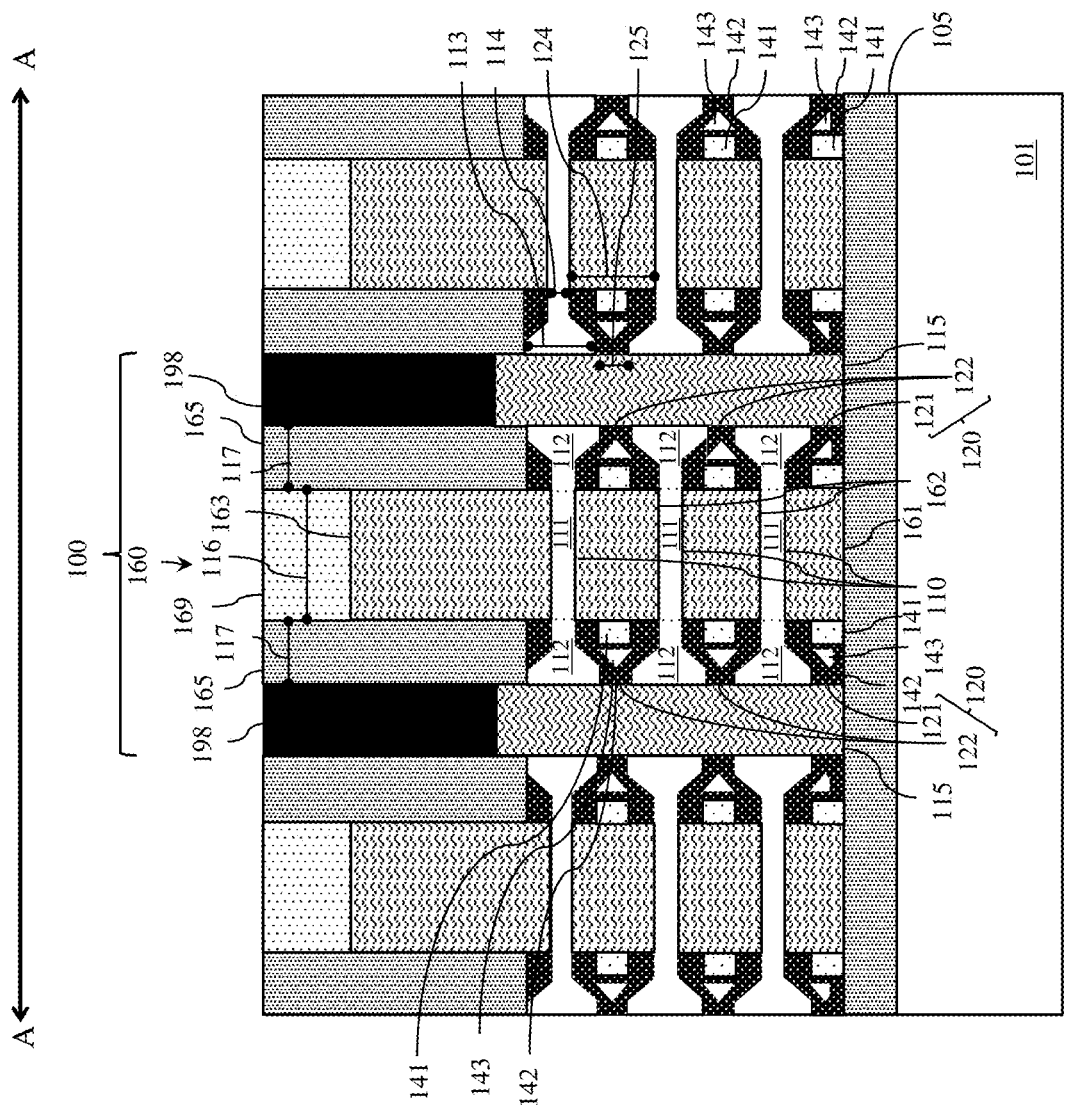

As mentioned above, with device size scaling, it has become challenging to form robust inner spacers for nanosheet-type gate-all-around field effect transistors (GAAFETs) using conventional processing techniques. Specifically, conventional GAAFET processing techniques typically include forming source/drain recesses in exposed portions of a multi-layer semiconductor body between adjacent sacrificial gates and etching back exposed vertical surfaces of alternating layers of the remaining portion of the multi-layer semiconductor body within the source/drain recesses in order to form inner spacer cavities. A layer of dielectric spacer material is then conformally deposited so as to fill the inner spacer cavities. Next, excess dielectric spacer material (i.e., any dielectric spacer material deposited outside of the inner spacer cavities) is selectively removed, thereby completing formation of inner spacers within the inner spacer cavities. However, with device size scaling and, particularly, as gate pitch decreases with each new technology node, the dielectric spacer material can pinch-off in the open space between adjacent gates (given the gate sidewall spacer, etc. thereon) during deposition. This pinching off of the dielectric spacer material may occur before the inner spacer cavities are filled resulting in defective inner spacers. Furthermore, regardless of whether pinching off of the dielectric spacer material occurs before or after the inner spacer cavities are completely filled, closing off of the spaces between adjacent gates can be problematic when trying to remove the excess dielectric spacer material. Specifically, the etch process to remove the excess dielectric spacer material is typically a selective isotropic wet etch process that must be tightly controlled in order to ensure that the dielectric spacer material is completely removed from the source/drain recesses, but not removed from the inner spacer cavities. To accomplish this, there must be adequate wet etchant exposure and, for adequate wet etchant exposure, there must be at least some open space (e.g., at least 3 nm) between adjacent gates (given the gate sidewall spacer, etc. thereon). One technique that could be employed to overcome the above-mentioned issues can include forming relatively shallow inner spacer cavities and depositing a relatively thin layer of dielectric spacer material to prevent the dielectric spacer material from pinching off in the spaces between adjacent gates. However, this technique results in relative thin inner spacers. Unfortunately, device size scaling is also associated with an increase in the parasitic capacitance between the source/drain regions and the gate and these thin inner spacers may not adequately reduce this parasitic capacitance.

In view of the foregoing, disclosed herein are embodiments of a nanosheet-type gate-all-around field effect transistor (GAAFET) with robust inner spacers. The GAAFET can include stacked nanosheets, which extend laterally between source/drain regions. Each nanosheet can have end portions (including source/drain extension regions) adjacent to the source/drain regions and a center portion (including a channel region) between the end portions. The end portions of each nanosheet can be tapered such that each nanosheet has a maximum thickness at the source/drain regions and a minimum thickness near and across the center portion. A gate can wrap around each center portion. Inner spacers can be aligned below the end portions and positioned laterally between internal portions of the gate and the adjacent source/drain regions. Each inner spacer can have a tapered thickness from a maximum thickness at the gate to a minimum thickness near the adjacent source/drain region. Each inner spacer can include a first spacer layer immediately adjacent to the gate, a second spacer layer that is also immediately adjacent to the gate at least above the first spacer layer and that further extends laterally beyond the first spacer layer toward or to the adjacent source/drain region and, optionally, an air-gap. Also disclosed herein are embodiments of a method of forming a GAAFET with robust inner spacers.

Figure 1E:
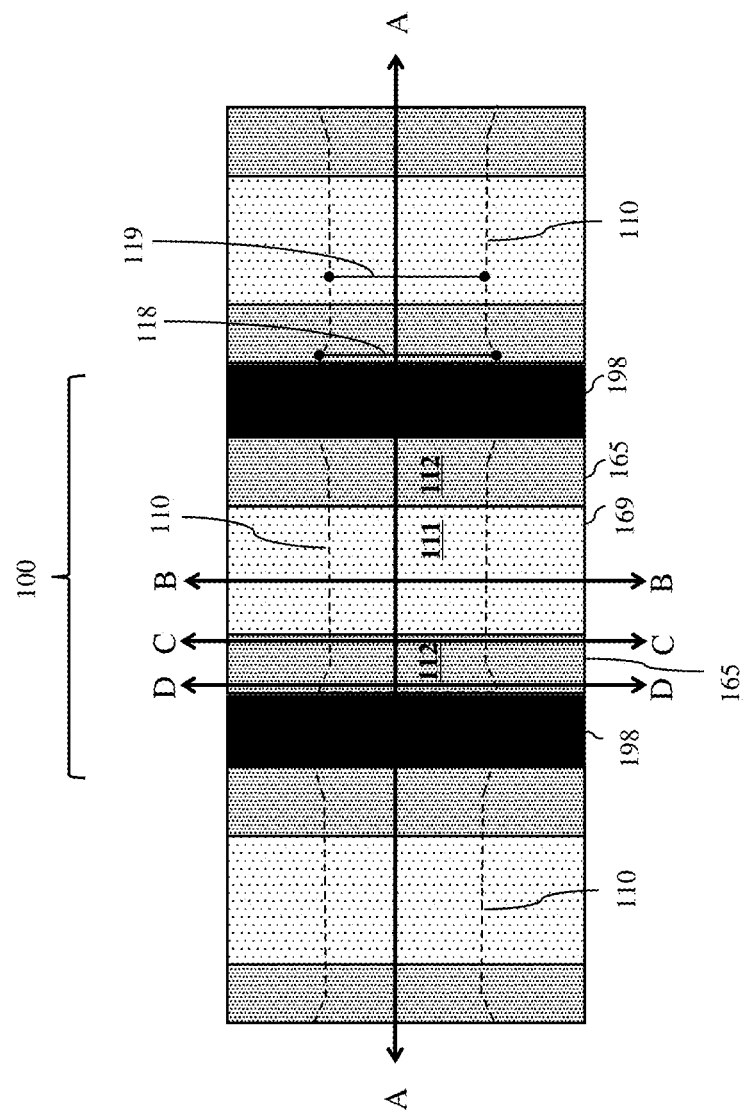
Figure 2:
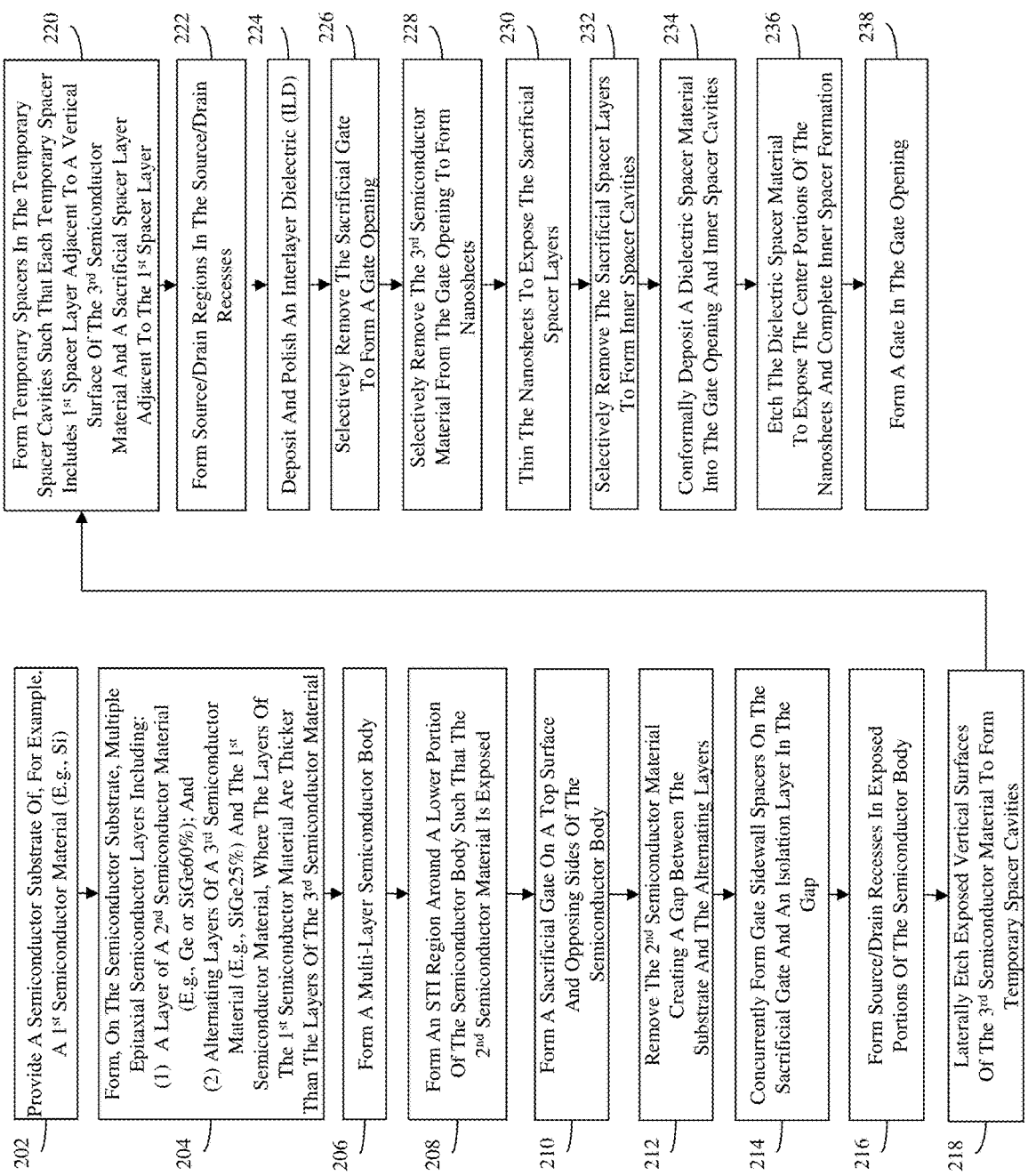
FIG. 2 is a flow diagram illustrating method embodiments for forming the semiconductor structure including the GAAFET of FIGS. 1A-1E.

More particularly, FIGS. 1A-1E are diagrams illustrating a semiconductor structure including the disclosed embodiments of a nanosheet-type gate-all-around field effect transistor (GAAFET) 100 with robust inner spacers 120. FIG. 1A is a vertical cross-section diagram (AA) of the semiconductor structure that extends across the length of the GAAFET 100. FIG. 1B is a different vertical cross-section diagram (BB) of the semiconductor structure that extends across the width of the GAAFET 100 through the gate 160 and channel regions. FIG. 1C is a different vertical cross-section diagram (CC) that extends across the width of the GAAFET 100 through a gate sidewall spacer 165 between the gate 160 and a source/drain region 115 and closer to the gate. FIG. 1D is a different vertical cross-section diagram (DD) that extends across the width of the GAAFET 100 also through the gate sidewall spacer 165 between the gate 160 and a source/drain region 115, but closer to the source/drain region 115. FIG. 1E is a top view diagram showing the relative positions of the cross-sections AA, BB, CC, and DD. The shape delineated by the dashed line within FIG. 1E represents a single nanosheet 110 within the GAAFET 100.

Referring to FIGS. 1A-1E, the semiconductor structure can include a semiconductor substrate 101. The semiconductor substrate 101 can be made of a first semiconductor material (e.g., monocrystalline silicon (Si)) or some other suitable monocrystalline semiconductor material.

The semiconductor structure can further include an isolation layer 105 on the top surface of the semiconductor substrate 101. The isolation layer 105 can be, for example, a low-K dielectric material. For purposes of this disclosure, a low-K dielectric material refers to a dielectric material having a dielectric constant (K) that is less than the dielectric constant of silicon dioxide ($SiO_2$) (i.e., K<3.9). Thus, for example, the isolation layer 105 can be silicon boron carbonitride (SiBCN), silicon oxycarbonitride (SiOCN), silicon carbonitride (SiCN) or any other suitable low-K dielectric material.

The semiconductor structure can further include a GAAFET 100 above the isolation layer 105. Optionally, the semiconductor structure can include a row GAAFETs 100 connected in series by shared source/drain regions, as illustrated. The semiconductor structure can further include isolation regions 102 in the substrate below the isolation layer 105 and on opposing sides of the GAAFET region such that they run parallel along the length of the GAAFET(s). As illustrated, these isolation regions 102 can be shallow trench isolation (STI) regions. That is, the isolation regions 102 can include trenches, which have been etched into the top surface of the semiconductor substrate 101 and which are filled with an isolation material. The isolation material can be, for example, silicon dioxide ($SiO_2$) or any other suitable isolation material.

In any case, the GAAFET 100 can include a pair of source/drain regions 115 above and immediately adjacent to the isolation layer 105. The source/drain regions 115 can include source/drain recesses filled with an epitaxial monocrystalline semiconductor material. The epitaxial monocrystalline semiconductor material can be, for example, epitaxial monocrystalline silicon (Si) or some other suitable epitaxial monocrystalline semiconductor material. In any case, the epitaxial monocrystalline semiconductor material of the source/drain regions 115 can be doped so that the source/drain regions 115 have an appropriate conductivity type and level given the conductivity type of the GAAFET 100. For example, for a P-type GAAFET, the source/drain regions 115 can be doped so as to have P-type conductivity at a relatively high conductivity level (i.e., P+ conductivity); whereas, for an N-type GAAFET, the source/drain regions 115 can be doped so as to have N-type conductivity at a relatively high conductivity level (i.e., N+ conductivity).

The GAAFET 100 can further include multiple semiconductor nanosheets 110. For purposes of this disclosure, a semiconductor nanosheet refers to a relatively thin, elongated, semiconductor body having at least a thickness dimension constrained to 100 nm or less. That is, the thickness of a nanosheet in the Y direction (i.e., as measured perpendicular to the top surface of the substrate) can be 100 nm or less. Optionally, the length of a nanosheet in the X direction (i.e., as measured across the length of the device from one source/drain region to the other) and/or the width of the nanosheet in the Z direction (i.e., as measured across the width of the device) can also be constrained to 100 nm or less. When the thickness of a nanosheet is approximately equal to its width, the nanosheet can be referred to as a nanowire. It should be noted that in prior art GAAFETs the nanosheets typically have an essentially uniform thickness. However, as discussed in greater detail below, in the GAAFET 100 disclosed herein end portions 112 of each nanosheet 110 are relatively thick as compared to the center portion 111.

The nanosheets 110 can extend laterally between the source/drain regions 115 and can be stacked vertically. The lowermost nanosheet can be above and physically separated from the isolation layer 105 and the center portion of the lower most nanosheet can be essentially parallel to the top surface of the isolation layer 105. One or more additional nanosheets can be stacked one above the other such that they are physically separated from each other and such that their center portions are parallel to each other. For purposes of illustration, FIGS. 1A-1E show three stacked nanosheets 110. However it should be understood that the figures are not intended to be limiting and that the GAAFET 100 could include any number of two or more nanosheets. In any case, each nanosheet 110 can be made of the first semiconductor material (e.g., monocrystalline silicon (Si)) or some other suitable monocrystalline semiconductor material.

Each nanosheet 110 can include end portions 112 immediately adjacent to the source/drain regions 115, respectively, and a center portion 111 positioned laterally between the end portions 112. The end portions 112 of each nano sheet 110 can be tapered toward the center portion 111 such that each nanosheet 110 has a maximum nanosheet thickness 113 and a maximum nanosheet width 118 at the junctions between the end portions 112 and the source/drain regions 115 and a minimum nanosheet thickness 114 (which is less than the maximum nanosheet thickness) and a minimum nanosheet width 119 (which is less than the maximum nanosheet width) in the end portions 112 near (i.e., close to) the center portion 111 and further extending across the length of the center portion 111.

In exemplary embodiments, the length 117 of each end portion 112 can be 3-7 nm (e.g., 5 nm) and the length 116 of the center portion 111 can be 10-20 nm (e.g., 15 nm) such that the overall length of each nanosheet is 16-34 nm (e.g., 25 nm). Additionally, in exemplary embodiments, the maximum nanosheet thickness 113 can be 11-15 nm (e.g., 13 nm), the minimum nanosheet thickness 114 can be 4-10 nm (e.g., 5 nm), the maximum nanosheet width 118 can be 10-70 nm, and the minimum nanosheet width can be 4-64 nm (but less than the maximum).

The center portions 111 of the nanosheets 110 can function as channel regions for the GAAFET 100 and, thus, can be either intrinsic (i.e., undoped) or doped so as to have an appropriate conductivity type and level given the conductivity type of the GAAFET. For example, for a P-type GAAFET, the center portions 111 (i.e., the channel regions) can be either undoped or doped so as to have N-type conductivity at a relatively low conductivity level (i.e., N– conductivity). For a N-type GAAFET, the center portions 111 (i.e., the channel regions) can be either undoped or doped so as to have P-type conductivity at a relatively low conductivity level (i.e., P– conductivity). The end portions 112 of the nanosheets 110 can function as source/drain extension regions for the GAAFET 100 and, thus, can be doped so as to have an appropriate conductivity type and level given the conductivity type of the GAAFET. For example, for a P-type GAAFET, the end portions 112 (i.e., the source/drain extension regions) can be doped so as to have P-type conductivity at a relatively low conductivity level (i.e., P– conductivity). For a N-type GAAFET, the end portions 112 (i.e., the source/drain extension regions) can be doped so as to have N-type conductivity at a relatively low conductivity level (i.e., N– conductivity).

The GAAFET 100 can further include a gate 160. The gate 160 can have a bottom surface above and immediately adjacent to the isolation layer 105. The gate 160 can further wrap around (i.e., cover the top, bottom and opposing side surfaces) of the center portions 111 of the nanosheets 110 (i.e., the channel regions), respectively. The gate 160 can be, for example, a replacement metal gate (RMG). The RMG can include: one or more conformal gate dielectric layers (e.g., a thin oxide layer and/or a high-K dielectric layer) immediately adjacent to the channel regions and one or more gate conductor layers (e.g., one or more conformal work function metal layer, a fill metal layer, etc.) on the gate dielectric layer. As discussed in greater detail below the work function metal layers may vary depending upon the conductivity type of the GAAFET. In any case, to avoid clutter in the drawings and to allow the reader to focus on the salient aspects of the disclosed structures, the specific gate dielectric layer(s) and gate conductor layer(s) within the gate 160 are not illustrated.

As illustrated, the gate 160 has internal portions 161-162 and an external portion 163. The internal portions are aligned below the nanosheets 110 and, particularly, below the center portion of each nanosheet and include a first internal portion 161 and at least one second internal portion 162. The first internal portion 161 extends vertically from the isolation layer 105 to the center portion 111 of the lowermost nanosheet. Each second internal portion 162 extends vertically between the center portions 111 of adjacent nanosheets 110, respectively. The external portion 163 extends across the width of the GAAFET 100 above and immediately adjacent to the center portion 111 of the uppermost nanosheet and further extends down opposing sides of the GAAFET 100. Additionally, the gate 160 can be capped by a dielectric gate cap 169. The gate cap 169 can be, for example, a silicon nitride (SiN) gate cap or a gate cap made of some other suitable dielectric gate cap material.

To provide electrical isolation between the gate 160 and the adjacent source/drain regions 115 and to minimize parasitic gate-to-source/drain capacitance, the GAAFET 100 can further include dielectric spacers. The dielectric spacers can include dielectric gate sidewall spacers 165 and dielectric inner spacers 121-122.

The gate sidewall spacers 165 can be positioned laterally immediately adjacent to outer sidewalls of the external portion 163 of the gate 160 and, particularly, between the gate 160 and the source/drain regions 115. Thus, gate sidewall spacers 165 can extend across the width of the GAAFET 100 above the end portions 112 of the uppermost nanosheet and can further extend down opposing sides of the GAAFET 100. These gate sidewall spacers 165 can have essentially the same length 117 as the end portions 112 of the nanosheets 110. As discussed in greater detail below with regard to the method, the gate sidewall spacers 165 and the isolation layer 105 can be formed concurrently. Thus, the gate sidewall spacers 165, like the isolation layer 105, can be made of a low-K dielectric material (e.g., silicon boron carbonitride (SiBCN), silicon oxycarbonitride (SiOCN), silicon carbonitride (SiCN) or any other suitable low-K dielectric material).

The inner spacers 120 can be positioned laterally between sidewalls of the internal portions 161-162 of the gate 160 (i.e., the portions of the gate 160 below each center portion 111 of each nanosheet 110) and the adjacent source/drain regions 115. Specifically, each internal portion of the gate 160 can extend laterally between a pair of inner spacers. Each inner spacer 120 can be aligned below and immediately adjacent to one of the end portions 112 of one of the nanosheets 110 and can further be positioned laterally between an internal portion of the gate 160 and an adjacent source/drain region 115. Thus, the inner spacers 120 also have essentially the same length 117 as the gate sidewall spacers 165 and the end portions 112 of the nanosheets 110. Due to the tapered shape of the end portions 112 of each nanosheet 110 and the fact that the inner spacers 120 are aligned below those end portions 112, each inner spacer 120 can also be tapered. That is, each inner spacer 120 can have a maximum spacer thickness 124 at the gate 160 and can taper down to a minimum spacer thickness 125 near the adjacent source/drain region 115. In exemplary embodiments, the maximum spacer thickness 124 can be 14-18 nm (e.g., 16 nm) and the minimum spacer thickness 125 can be 3-5 nm (e.g., 4 nm).

Each inner spacer 120 can include a first spacer layer 141, which is vertically oriented, extends across the width of the GAAFET 100 and is positioned laterally immediately adjacent to a sidewall of an internal portion of the gate 160. The thickness of the first spacer layer 141 as measured in the X direction (i.e., along the length of inner spacer 120 from the gate 160 toward the adjacent source/drain region 115) can be approximately one-third to two-thirds the length 117. For example, if the length 117 (which, as mentioned above, corresponds to the lengths of the gate sidewall spacers 165, the end portions 112 of the nanosheet 110 and the inner spacers 120) is 5 nm, then the thickness of the first spacer layer 141 could be 2-3 nm. A height of each first spacer layer 141 can be 2-6 nm (e.g., 4 nm).

Each inner spacer 120 can further include a second spacer layer 142. The second spacer layer 142 can extend laterally across the width of the GAAFET 100 and can be immediately adjacent to the internal portion of the gate 160 at least above the first spacer layer 141 and, possibly, also below the first spacer layer 141. Specifically, due to the processing techniques used to form the GAAFET 100 (see the discussion of the method below), the inner spacers 120 include first inner spacers 121 and second inner spacers 122 with slightly different structures. As mentioned above, the internal portions of the gate 160 include a first internal portion 161, which extends vertically between the isolation layer 105 and the lowermost nanosheet, and at least one second internal portion 162, which extends vertically between adjacent nanosheets. The first inner spacers 121 are adjacent to the first internal portion 161 of the gate 160 and second inner spacers 122 are adjacent to each second internal portion 162 of the gate 160. In each first inner spacer 121, the first spacer layer 141 is above and immediately adjacent to the isolation layer 105 and further positioned laterally immediately adjacent to a lower portion of a sidewall of the first internal portion 161 of the gate 160. The second spacer layer 142 is above the first spacer layer 141 and positioned laterally immediately adjacent to an upper portion of that sidewall of that first internal portion of the gate. Thus, in the first inner spacer 121, the second spacer layer 142 only contacts the first internal portion 161 of the gate 160 above the first spacer layer 141 (i.e., not below). In each second inner spacer 122, the first spacer layer 141 is positioned laterally immediately adjacent to a center portion of a sidewall of a second internal portion 162 of the gate 160. The second spacer layer 142 further wraps around the first spacer layer 141 such that it positioned laterally immediately adjacent to both an upper portion and a lower portion of the sidewall of the second internal portion of the gate. Thus, in the second inner spacer 122, the second spacer layer 142 contacts the second internal portion 162 of the gate 160 both above and below the first spacer layer 141.

In any case, in each inner spacer 120, the second spacer layer 142 can extend laterally from the gate 160 beyond first spacer layer 141 toward or to the adjacent source/drain region 115. Depending upon the dimensions of the inner spacer cavities in which these inner spacers 120 are formed (including the size of the openings into the cavities) and further depending on the thickness of the dielectric spacer material that is conformally deposited into the cavities to form the second spacer layers 142 of the inner spacers 120, the dielectric spacer material may pinch-off within the openings to the cavities before those cavities are completely filled and the resulting inner spacers 120 will be air-gap inner spacers. That is, each inner spacer 120 will include the first spacer layer 141 and the second spacer layer 142 (as discussed above) and will also include an air-gap 143 positioned laterally somewhere between the first spacer layer 141 and the adjacent source/drain region 115. Such an air-gap 143 provides the added advantage of further reducing parasitic capacitance between the gate 160 and the adjacent source/drain region 115.

For example, if, during processing, the dielectric spacer material is conformally deposited into the inner spacer cavities such that it covers the internal surfaces of those cavities but pinches off at the openings to the cavities before those cavities are completely filled, then the resulting inner spacers 120 will each include an air-gap 143 that is fully encapsulated by the second spacer layer 142 in an area between the first spacer layer 141 and the adjacent source/drain region 115 (e.g., as illustrated in the embodiment of the GAAFET 100 shown in FIGS. 1A-1E).

It should, however, be understood that the figures are not intended to be limiting and that other GAAFET embodiments are anticipated, given possible variations in the dimensions of the inner spacer cavities and/or possible variations in the thickness of the conformally deposited dielectric spacer material. For example, one embodiment of the GAAFET 100 could include air-gap inner spacers, where the second spacer layer 142 does not cover all surfaces within the inner spacer cavity, does not completely encompass the air-gap 143 and/or does not extend across the full length of the inner spacer to the adjacent source/drain region 115. Alternatively, another embodiment of the GAAFET 100 could include inner spacers that are devoid of any air-gaps (i.e., where the inner spacer cavities are completely filled by the first and second spacer layers 141-142).

In any case, the dielectric spacer materials used for the first and second spacer layers 141-142 could be the same. For example, the dielectric spacer material used for both the first and second spacer layers 141-142 could be silicon nitride (SiN). Alternatively, the dielectric spacer materials used for the first and second spacer layers 141-142 can be different. For example, the dielectric spacer material used for the first spacer layers 141 can be silicon nitride (SiN) and the dielectric spacer material used for the second spacer layers 142 can be some low-K dielectric material. Regardless of whether the dielectric spacer material used for the second spacer layers 142 of the inner spacers 120 is the same or different from that used the first spacer layers 141 of the inner spacers 120, the dielectric spacer material used for the second spacer layers should be different from the dielectric materials of the interlayer dielectric (ILD) layer(s), the gate sidewall spacers 165, and the isolation layer 105 so that it can be selectively and isotropically etched during inner spacer formation without impacting exposed ILD, gate sidewall spacer or isolation layer surfaces. Thus, for example, if the ILD material is silicon dioxide ($SiO_2$) and the isolation layer 105 and gate sidewall spacers 165 are made of silicon boron carbonitride (SiBCN), silicon oxycarbonitride (SiOCN), or silicon carbonitride (SiCN), then the dielectric spacer material of the second spacer layer 142 could be silicon oxycarbide (SiOC). It should be understood that the exemplary combination of materials mentioned above is not intended to be limiting and that alternative combinations could be employed. For example, if the ILD material is silicon dioxide ($SiO_2$) and the isolation layer 105 and gate sidewall spacers 165 are made of silicon boron carbonitride (SiBCN), then the dielectric spacer material of the second spacer layer 142 could be made of silicon oxycarbide (SiOC), silicon oxycarbonitride (SiOCN), or silicon carbonitride (SiCN) and so on.

In addition to the features described above, the semiconductor structure can further include, for example: metal plugs 198 on the source/drain regions 115; one or more middle of the line (MOL) dielectric layers (e.g., an etch stop layer, an ILD layer, etc.) (not shown) over the GAAFET(s) 100; and one or more contacts (also not shown) extending vertically through the MOL dielectric layer(s) to the GAAFET(s) 100. Such features are well known in the art and, thus, the details thereof have been omitted from this specification in order to allow the reader to focus on the salient aspects of the disclosed embodiments.

Referring to the flow diagram of FIG. 2 and FIGS. 3A-16D, also disclosed herein are embodiments of a method for forming a semiconductor structure that includes at least one nanosheet-type gate-all-around field effect transistor (GAAFET) with robust inner spacers, such as the GAAFET 100, described above and illustrated in FIGS. 1A-1E. It should be understood that the cross-sections AA, BB, CC, and DD in FIGS. 3A-16D correspond to the locations of the cross-sections with the same labels AA, BB, CC, and DD shown in FIG. 1A-1E.

The method can begin with a semiconductor substrate 101 (see process step 202 and FIGS. 3A-3B). The semiconductor substrate 101 can be a bulk semiconductor wafer. The bulk semiconductor wafer can be made, for example, of a first semiconductor material 301 (e.g., monocrystalline silicon) or some other suitable monocrystalline semiconductor material.

Multiple monocrystalline semiconductor layers can then be formed on the top surface of the semiconductor substrate 101 (see process step 204 and FIGS. 3A-3B). These semiconductor layers can be formed, for example, by epitaxial deposition and can include an initial layer of a second semiconductor material 302 and alternating layers of a third semiconductor material 303 and the first semiconductor material 301. For example, in one exemplary embodiment, the first semiconductor material 301 can be monocrystalline silicon (Si), the second semiconductor material 302 can be either monocrystalline germanium (Ge) or monocrystalline silicon germanium (SiGe) with a relatively high percentage of germanium (e.g., SiGe 60%), and the third semiconductor material can be monocrystalline silicon germanium with a relatively low percentage of germanium and, particularly, a lower percentage of germanium than in the second semiconductor material (e.g., SiGe 25%). In any case, the second semiconductor material 302 can be preselected so that it can be selectively etched over the first semiconductor material 301 and the third semiconductor material 303 (i.e., so that it can be selectively removed during subsequent processing). Similarly, the third semiconductor material 303 can be preselected so that it can be selectively etched over the first semiconductor material 301 (i.e., so it can be selectively removed during subsequent processing).

As illustrated, the layers of the third semiconductor material 303 can be relatively thin as compared to the layers of the first semiconductor material 301 and the layer of the second semiconductor material 302. Additionally, the layer of the second semiconductor material 302 can be relatively thin as compared to the layers of the first semiconductor material 301. In exemplary embodiments, the layers of the first semiconductor material 301 can each have a thickness of 11-15 nm (e.g., 13 nm), the layers of the third semiconductor material 303 can have a thickness of 3-5 nm (e.g., 4 nm) and the layer of the second semiconductor material can have a thickness of 8-12 nm (e.g., 10 nm).

It should be noted that the layers of the first semiconductor material will be used during subsequent processing to form nanosheets, which will have center portions that function as channel regions and end portions that function as source/drain extension regions. Thus, the layers of the first semiconductor material 301 can be either intrinsic (i.e., undoped) or in situ doped during epitaxial deposition so as to have the desired conductivity type and level for the channel regions. Those skilled in the art will recognize that the conductivity type will vary depending upon the conductivity type of the GAAFET being formed. For example, for a P-type GAAFET, the channel regions will be either intrinsic (i.e., undoped) or doped so as to have N-type conductivity at a relatively low conductivity level (i.e., N− conductivity). For an N-type GAAFET, the channel regions will be either intrinsic (i.e., undoped) or doped so as to have P-type conductivity at a relatively low conductivity level (i.e., P− conductivity). As discussed in greater detail below, doping of the source/drain extension regions is performed during subsequent processing.

A multi-layer semiconductor body 310 (e.g., an essentially rectangular-shaped body or fin-shaped body) can then be formed from this partially completed structure (see process step 206 and FIGS. 3A-3B). The semiconductor body 310 can be formed, for example, using conventional lithographic patterning and etch processes, sidewall image transfer processes, etc. It should be noted that the semiconductor body 310 should be formed at process step 206 by etching through each of the semiconductor layers and into an upper portion of the semiconductor substrate 101 such that trenches are formed in the top surface of the semiconductor substrate 101.

Next, an isolation region 102 (e.g., a shallow trench isolation (STI) region) can be formed within the trenches (see process step 208 and FIGS. 3A-3B). Specifically, an isolation material (e.g., silicon dioxide ($SiO_2$)) can be deposited and etched back such that the layer of the second semiconductor material 302 is exposed.

Figure 4A:
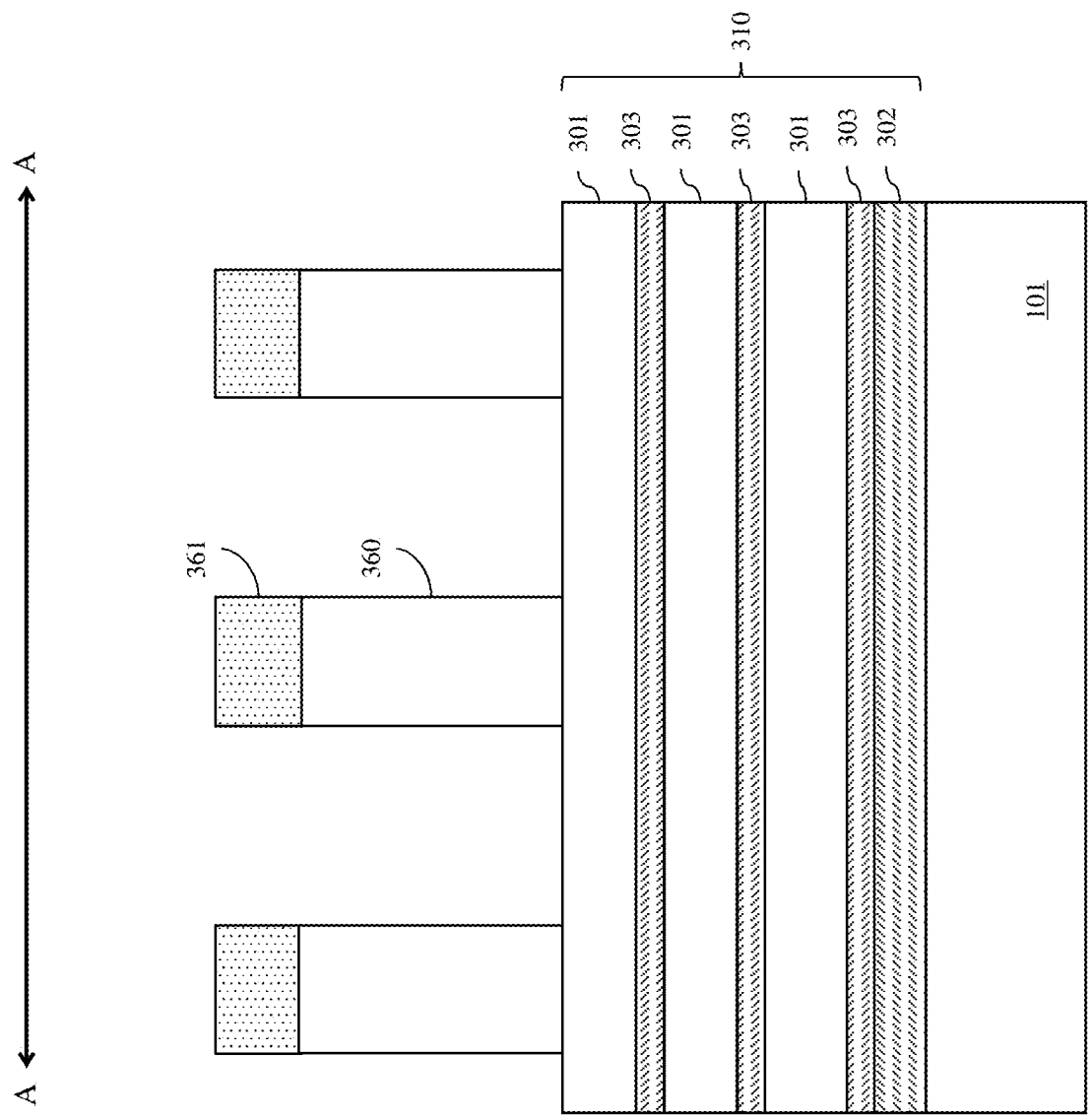

Next, a sacrificial gate 360 with a sacrificial gate cap 361 can be formed adjacent to the top surface and opposing sides of the semiconductor body 310 (see process step 210 and FIGS. 4A-4C). For example, a thin conformal dielectric layer (e.g., a thin silicon dioxide layer (not shown)) can be deposited over the partially completed structure. Then, a blanket sacrificial gate layer can be deposited onto the conformal dielectric layer. This blanket sacrificial gate layer can be, for example, a polysilicon layer, an amorphous silicon layer or any other suitable sacrificial gate material that is different from the materials of the semiconductor body 310 (e.g., different from the first semiconductor material, the second semiconductor material, and the third semiconductor material) and that can be selectively and isotropically etched away from these materials during subsequent processing. The sacrificial gate layer can then be polished (e.g., using a CMP process) and a sacrificial dielectric cap layer (e.g., a silicon nitride (SiN) cap layer) can be deposited onto the sacrificial gate layer. The resulting sacrificial gate stack can then be lithographically patterned and etched to form the sacrificial gate 360 with the sacrificial gate cap 361. It should be noted that the patterning and etch processes can be performed at process step 210 such that the sacrificial gate is on a first portion and, particularly, a designated channel portion of the semiconductor body 310 and such that second portions and, particularly, designated source/drain portions extend laterally beyond the sacrificial gate 360.

Figure 5A:
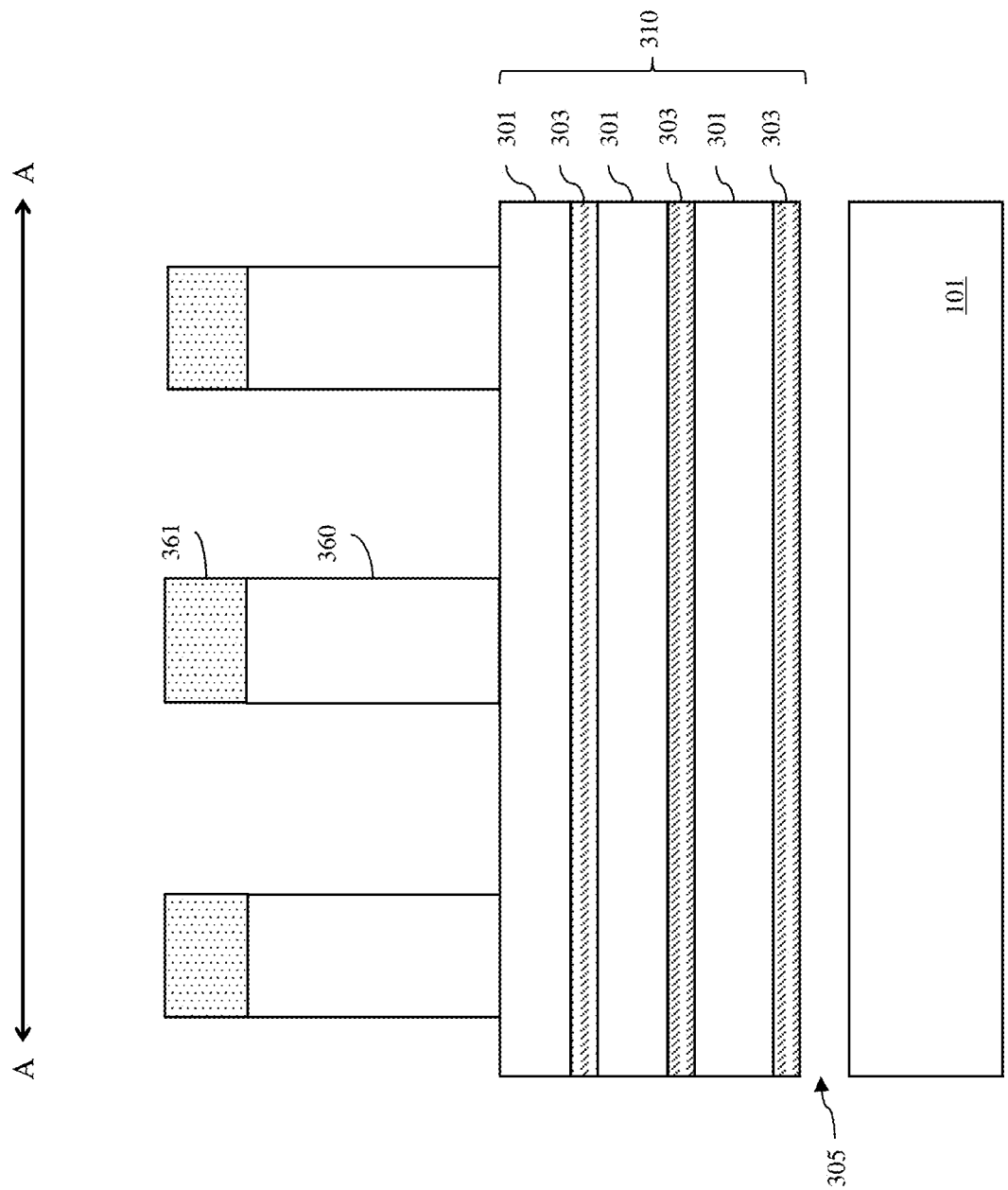

Next, the layer of the second semiconductor material 302 can be selectively removed from the semiconductor body 310, including from the first portion of the semiconductor body 310 under the sacrificial gate 360, in order to form a gap 305 (i.e., a buried insulator cavity) between the top surface of the semiconductor substrate 101 and the alternating layers of the third semiconductor material 303 and the first semiconductor material 301 above (see process step 212 and FIGS. 5A-5C). Specifically, an isotropic etch process that is selective for the second semiconductor material 302 over the first semiconductor material 301, over the third semiconductor material 303, over the sacrificial materials of the sacrificial gate 360 and the sacrificial gate cap 361 thereon, and over the isolation material of the STI regions 102 can be performed in order to completely remove the second semiconductor material 302, leaving the other above-mentioned materials essentially intact and creating the gap 305. For example, as mentioned above in an embodiment disclosed herein, the first semiconductor material 301 can be Si, the second semiconductor material 302 can be SiGe60%, the third semiconductor material can be SiGe25%, the sacrificial gate 360 can be poly or amorphous Si, the sacrificial gate cap can be SiN, and the isolation material of the STI regions 102 can be $SiO_2$. In this case, the SiGe60% can be selectively removed, for example, using a hydrogen chloride (HCl) or chlorine trifluoride ($ClF_3$) vapor phase etch process.

Figure 6A:
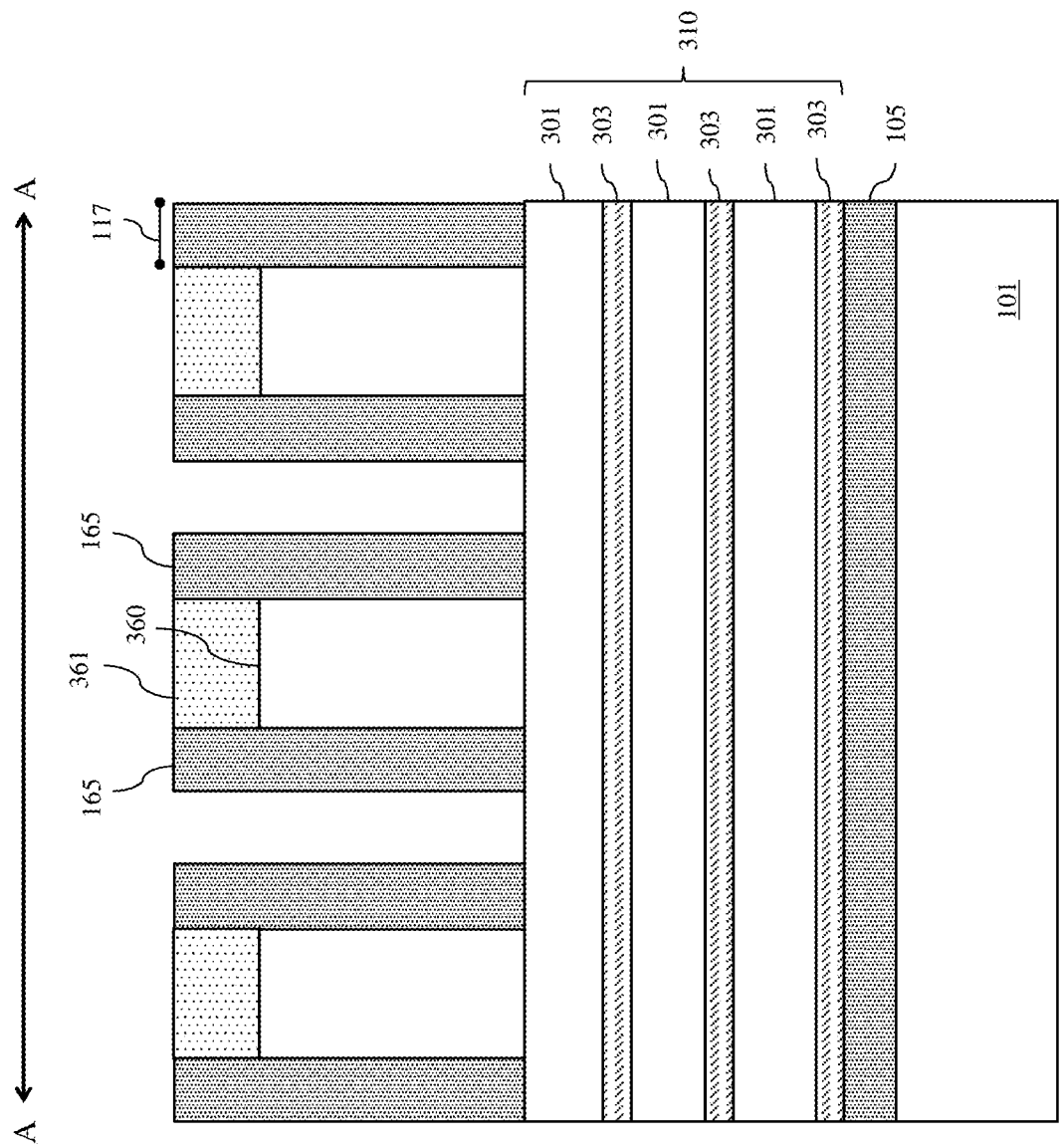
FIGS. 6A-6C are different cross-section diagrams illustrating a partially completed structure formed according to the flow diagram of FIG. 2.
Figure 6C:
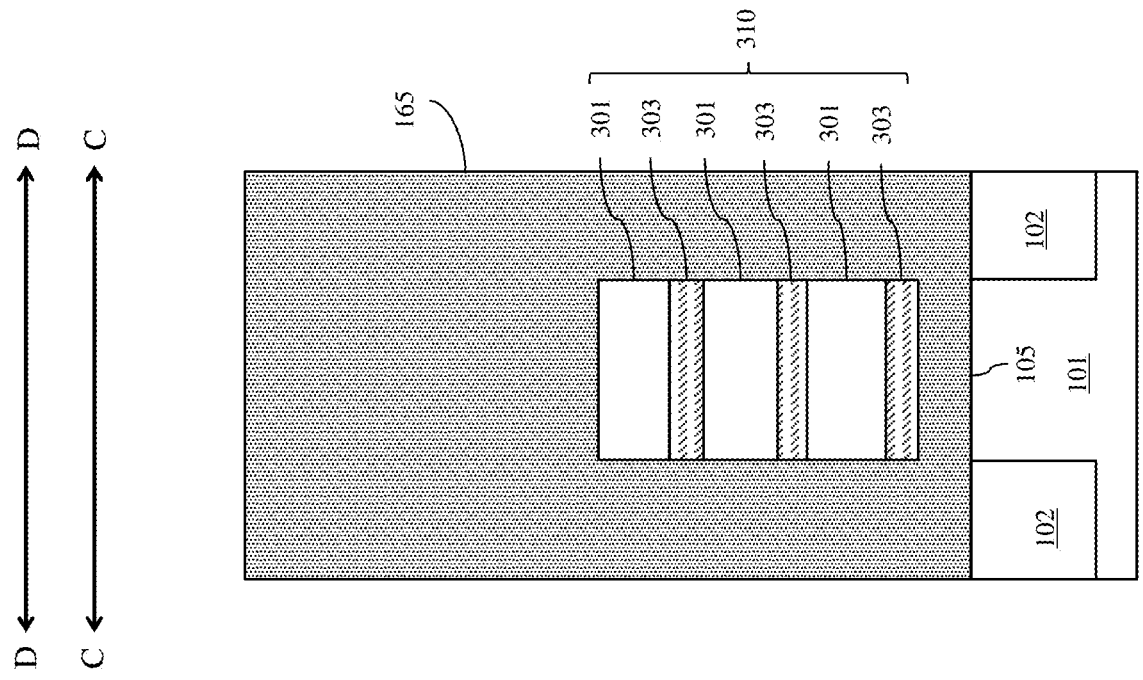
Figure 6B:
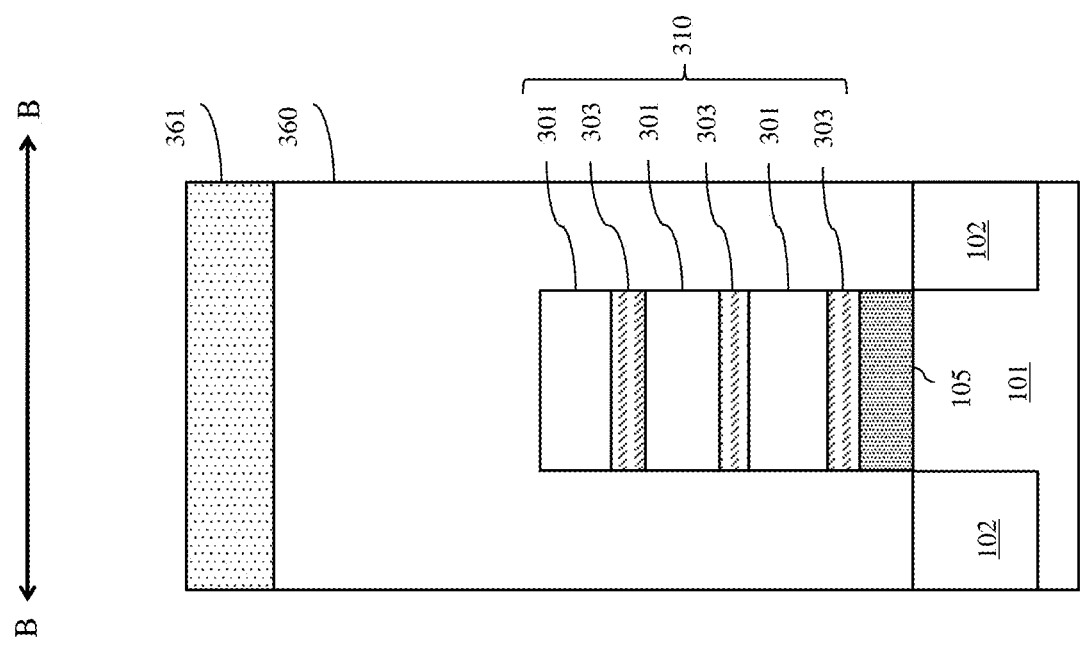

After the second semiconductor material 302 is selectively removed, gate sidewall spacers 165 can be formed adjacent to external sidewalls of the sacrificial gate 360 and, concurrently, an isolation layer 105 can be formed in the gap 305 (see process step 214 and FIGS. 6A-6C). Specifically, a gate sidewall spacer/isolation material can be conformally deposited over the partially completed structure and into the gap 305. Then an anisotropic etch process can be performed to remove exposed horizontal portions of this material. The remaining vertical portions on the sidewalls of the sacrificial gate 360 will form the gate sidewall spacers 165. Additionally, the unexposed horizontal portions within the gap 305 will form an isolation layer 105. The gate sidewall spacer/isolation material can be, for example, a low-K dielectric material. For purposes of this disclosure, a low-K dielectric material refers to a dielectric material having a dielectric constant (K) that is less than the dielectric constant of silicon dioxide ($SiO_2$) (i.e., K<3.9). Thus, for example, the gate sidewall spacer/isolation material can be silicon boron carbonitride (SiBCN), silicon oxycarbonitride (SiOCN), silicon carbonitride (SiCN) or any other suitable low-K dielectric material. It should be noted that the thickness of the conformally deposited layer of the gate sidewall spacer/isolation material will be such that the resulting gate sidewall spacers 165 have a desired length 117 (as measured in a direction parallel to the length of the semiconductor body 310).

Figure 7:
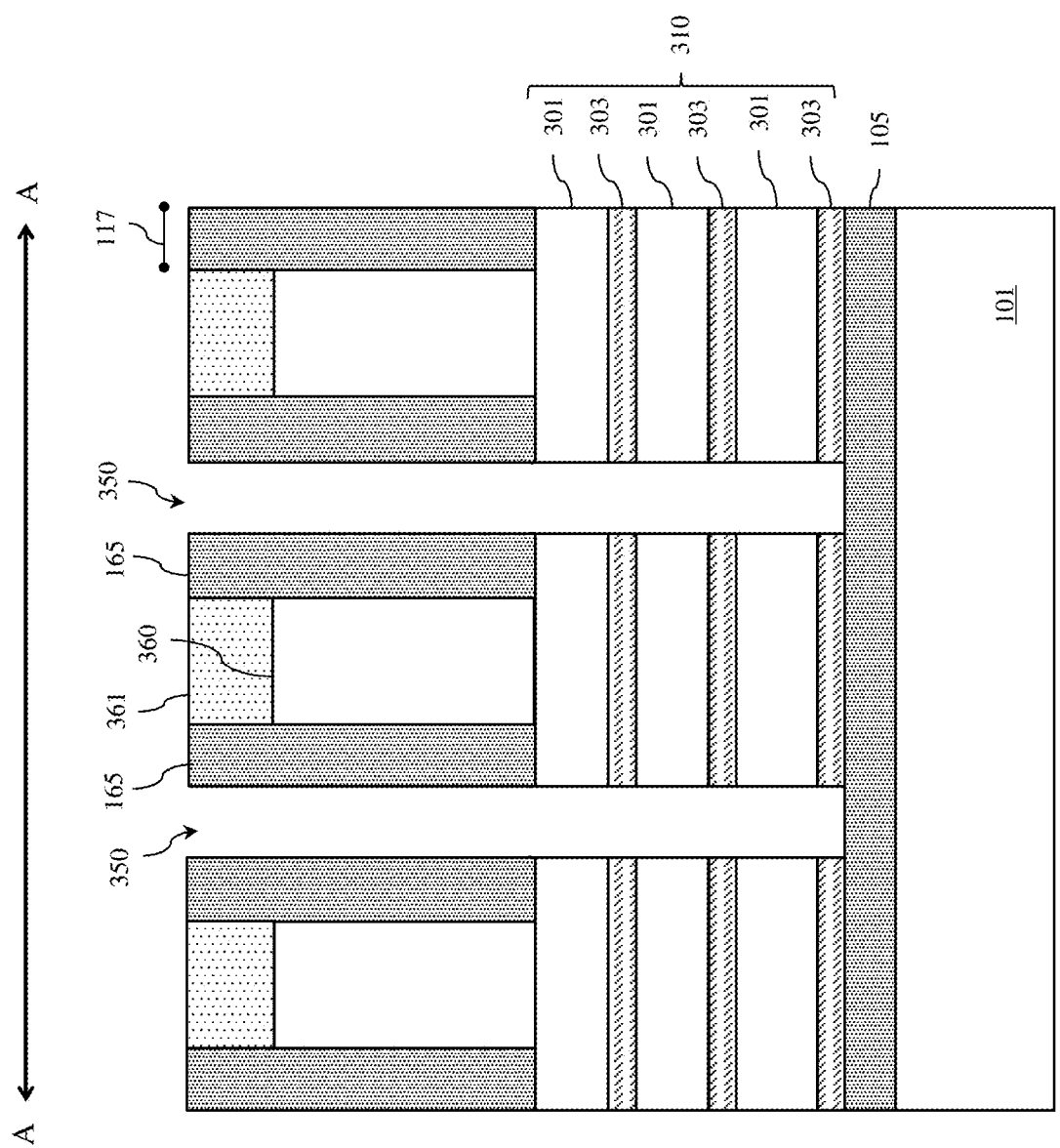
FIG. 7 is a cross-section diagram illustrating a partially completed structure formed according to the flow diagram of FIG. 2.

Source/drain recesses 350 can then be formed in the exposed second portions of the semiconductor body 310 (i.e., the portions of the semiconductor body 310 that extend laterally beyond the sacrificial gate 360 and gate sidewall spacers 165) (see process step 216 and FIG. 7). Specifically, an anisotropic etch process can be performed, wherein the etch chemistries used are selective for the first semiconductor material 301 and the third semiconductor material 303 of the semiconductor body 310 over the exposed dielectric materials of the gate sidewall spacer 165, the sacrificial gate cap 361, and the isolation layer 105. Thus, this etch process will completely remove the exposed portions of the semiconductor body 310 stopping on the isolation layer 105. Additionally, as a result of this etch process, essentially vertical surfaces of the remaining first portion of the semiconductor body 310 under the sacrificial gate 360 and gate sidewall spacers 165 will be exposed within each source/drain recess 350 and essentially vertically aligned with the outermost edge of the gate sidewall spacers 165.

Figure 8B:
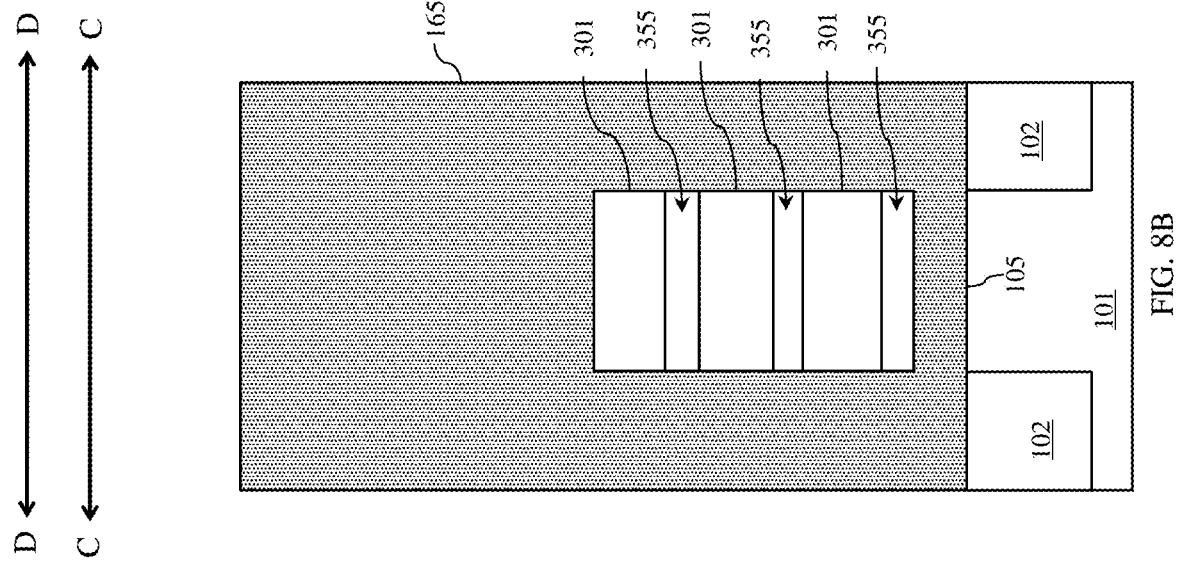
FIGS. 8A-8B are different cross-section diagrams illustrating a partially completed structure formed according to the flow diagram of FIG. 2.
Figure 8A:
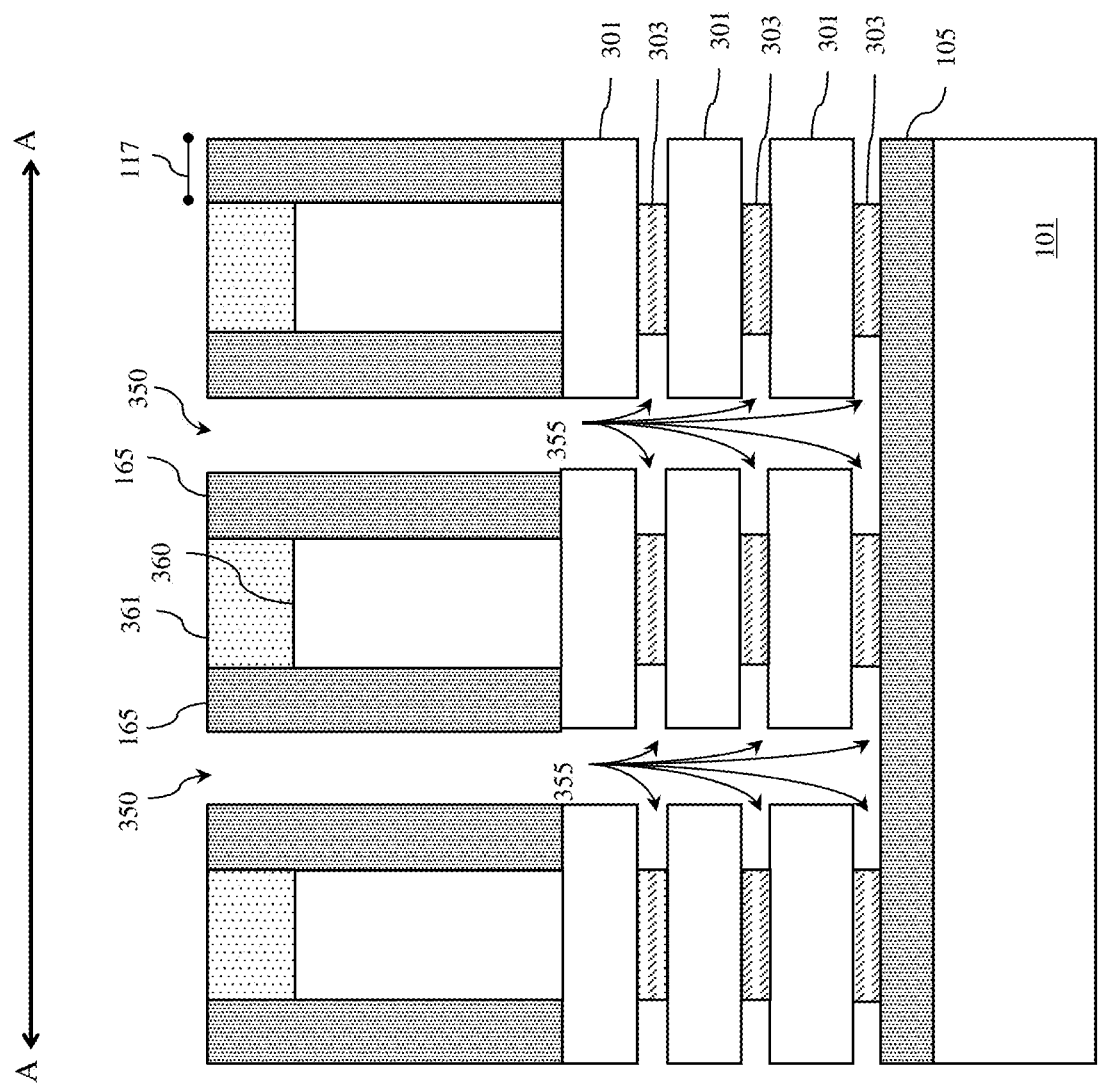
Figure 9A:
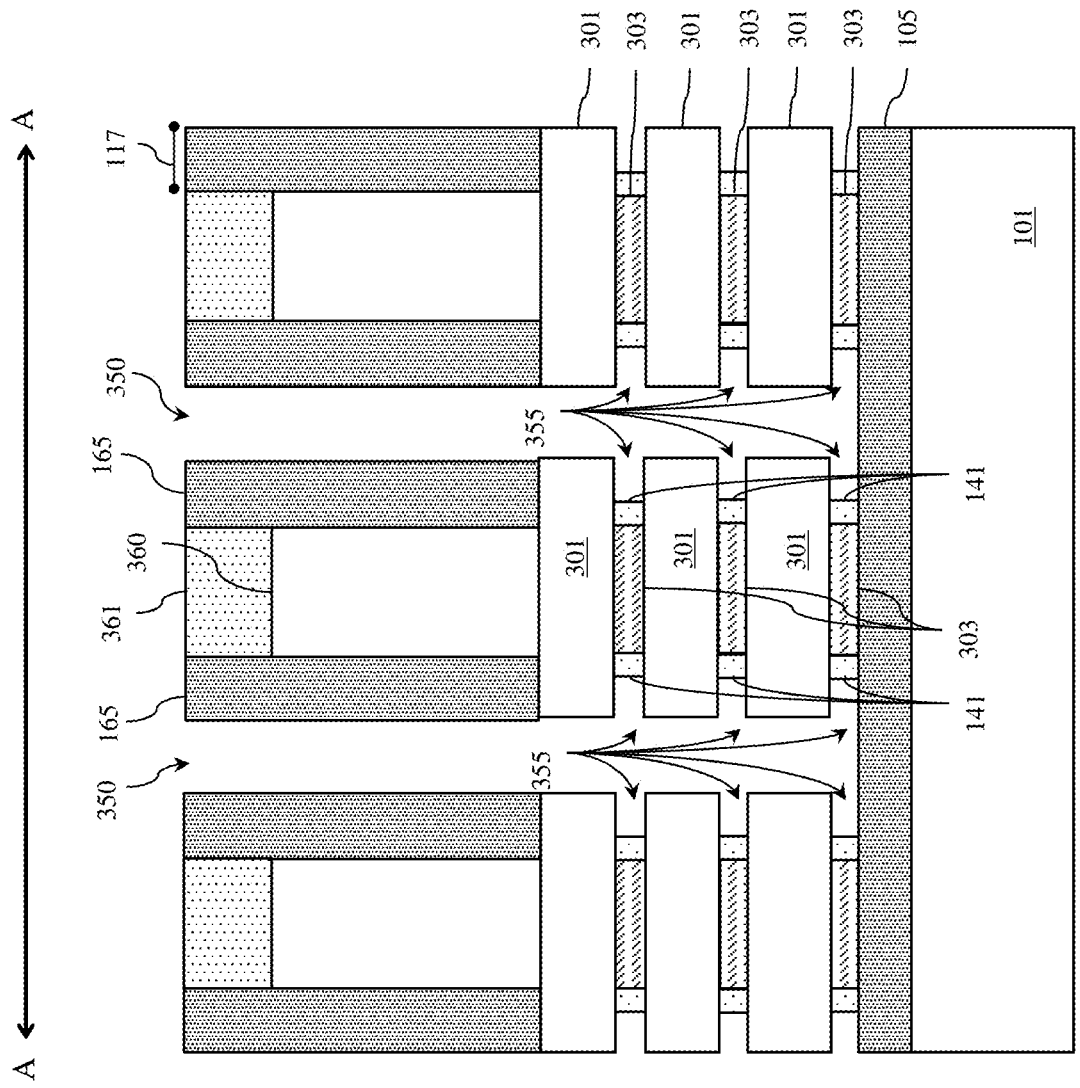
FIGS. 9A-9C are different cross-section diagrams illustrating a partially completed structure formed according to the flow diagram of FIG. 2.
Figure 9C:
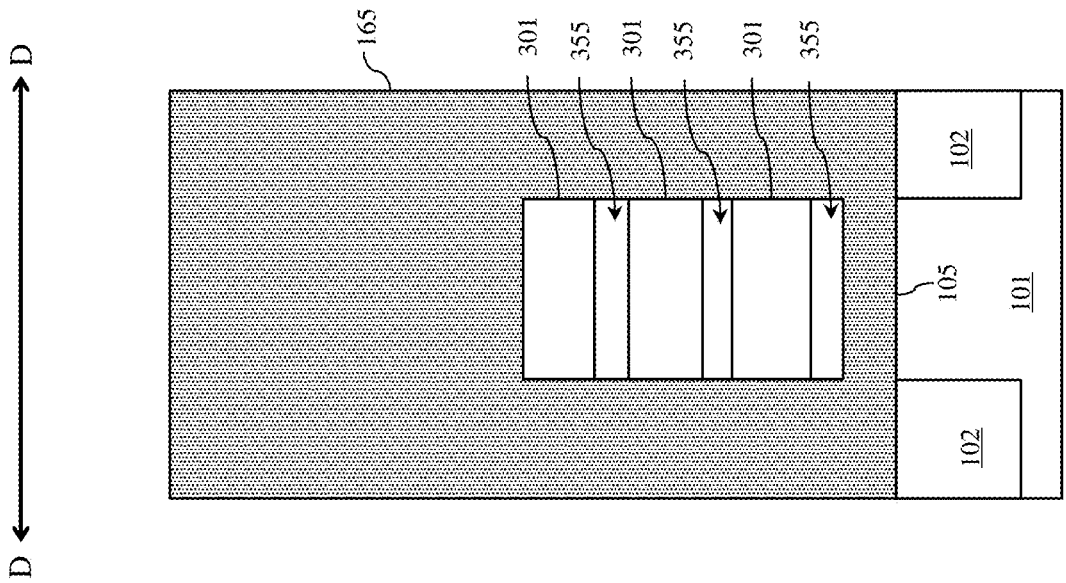
Figure 9B:
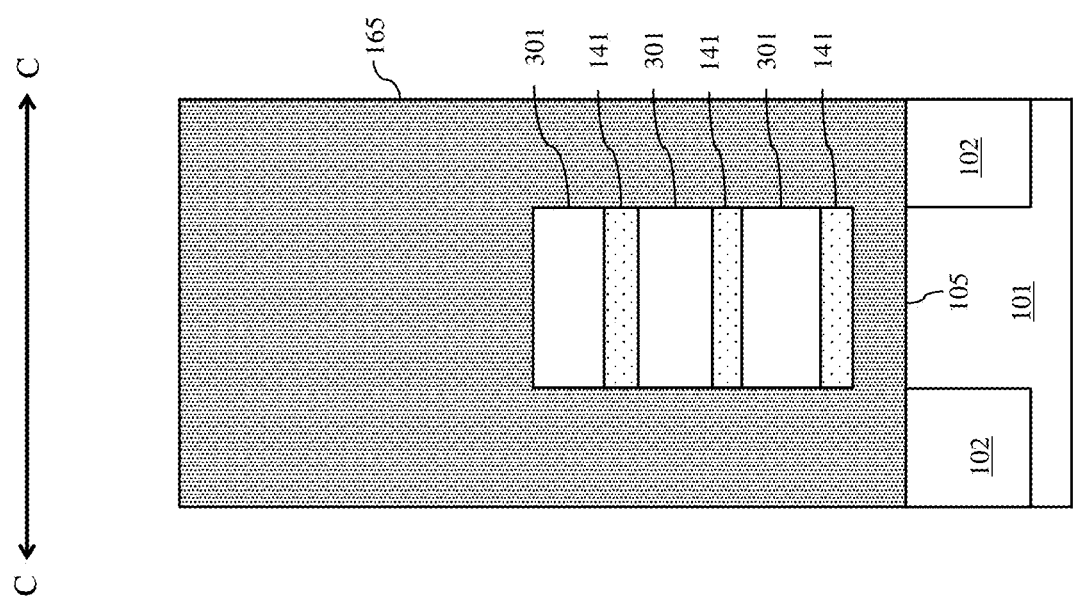
Figure 10A:
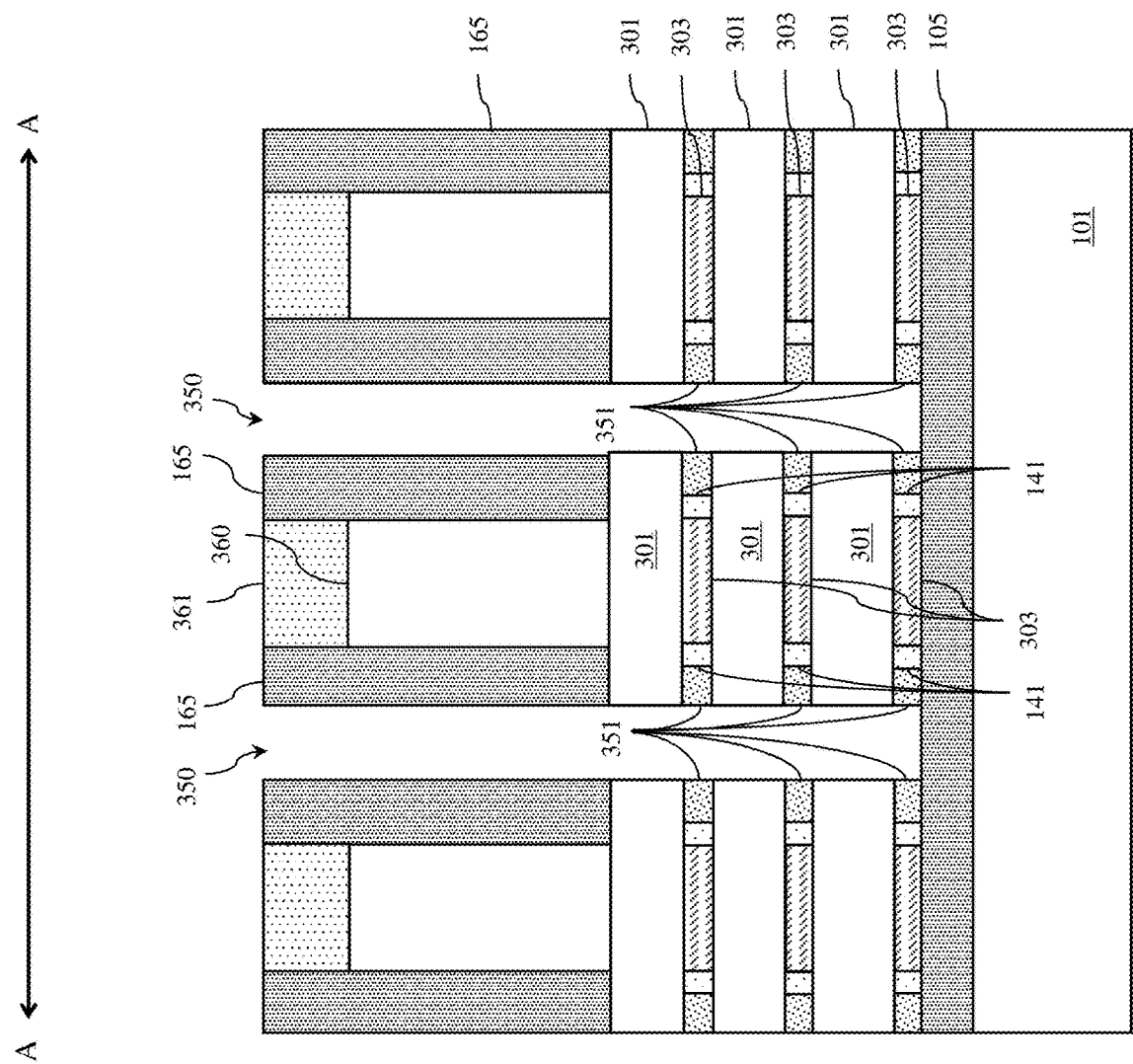

Next, the third semiconductor material 303, which is exposed at these vertical surfaces, can be laterally etched to form temporary spacer cavities 355 (see process step 218 and FIGS. 8A-8B). Specifically, the temporary spacer cavities 355 can be formed in the sides of the source/drain recesses 350 adjacent to the sacrificial gate 360 and using a selective isotropic etch process that is selective for the third semiconductor material 303 over the other exposed materials of the partially completed structure, thereby creating the temporary spacer cavities 355. For example, in the exemplary embodiment where the first semiconductor material 301 is Si and the third semiconductor material is SiGe 25%, selective lateral etching of the third semiconductor material 303 can be accomplished using, for example, a chlorine trifluoride ($ClF_3$) vapor phase etch process or a wet etch process that employs a standard clean solution no. 1 (SC1) at an elevated temperature (e.g., approximately 40° C.). In any case, the etch process can specifically be timed such that the depth of the temporary spacer cavities 355 is approximately equal to the length 117 of the gate sidewall spacers 165.

Temporary inner spacers can then be formed in the temporary spacer cavities 355 (see process step 220). Specifically, a layer of dielectric spacer material can be conformally deposited over the partially completed structure and specifically into the temporary spacer cavities 355. The dielectric spacer material can be, for example, silicon nitride (SiN). A selective isotropic etch process can then be performed to remove excess SiN outside the temporary spacer cavities and to further recess the SiN within the temporary spacer cavities, thereby creating a relatively thin, vertically oriented, first spacer layer 141 (e.g., a 2-3 nm SiN layer) at the back end of each temporary spacer cavity 355 close to the sacrificial gate (see FIGS. 9A-9C). The height of each first spacer layer 141 will be equal to the thickness of the adjacent layer of the third semiconductor material 303. Next, a sacrificial spacer material can be conformally deposited over the partially completed structure and specifically into the temporary spacer cavities 355 so as to fill the remaining space within those cavities 355. The sacrificial spacer material can be a different from the dielectric spacer material used to form the first spacer layers 141 so that, during subsequent processing, the sacrificial spacer material can be selectively removed from the temporary spacer cavities leaving the first spacer layers 141 intact. For example, the sacrificial spacer material can be silicon carbide (SiC) or silicon oxycarbide (SiOC). A selective isotropic etch process can then be performed to remove any excess sacrificial spacer material from outside the temporary spacer cavities, thereby forming a sacrificial spacer layer 351 within each temporary spacer cavity 355 positioned laterally adjacent to the first spacer layer 141 and completing the temporary spacers (see FIGS. 10A-10C). This etch process is also specifically performed so as to expose the vertical surfaces of the first semiconductor material 301.

Figure 11:
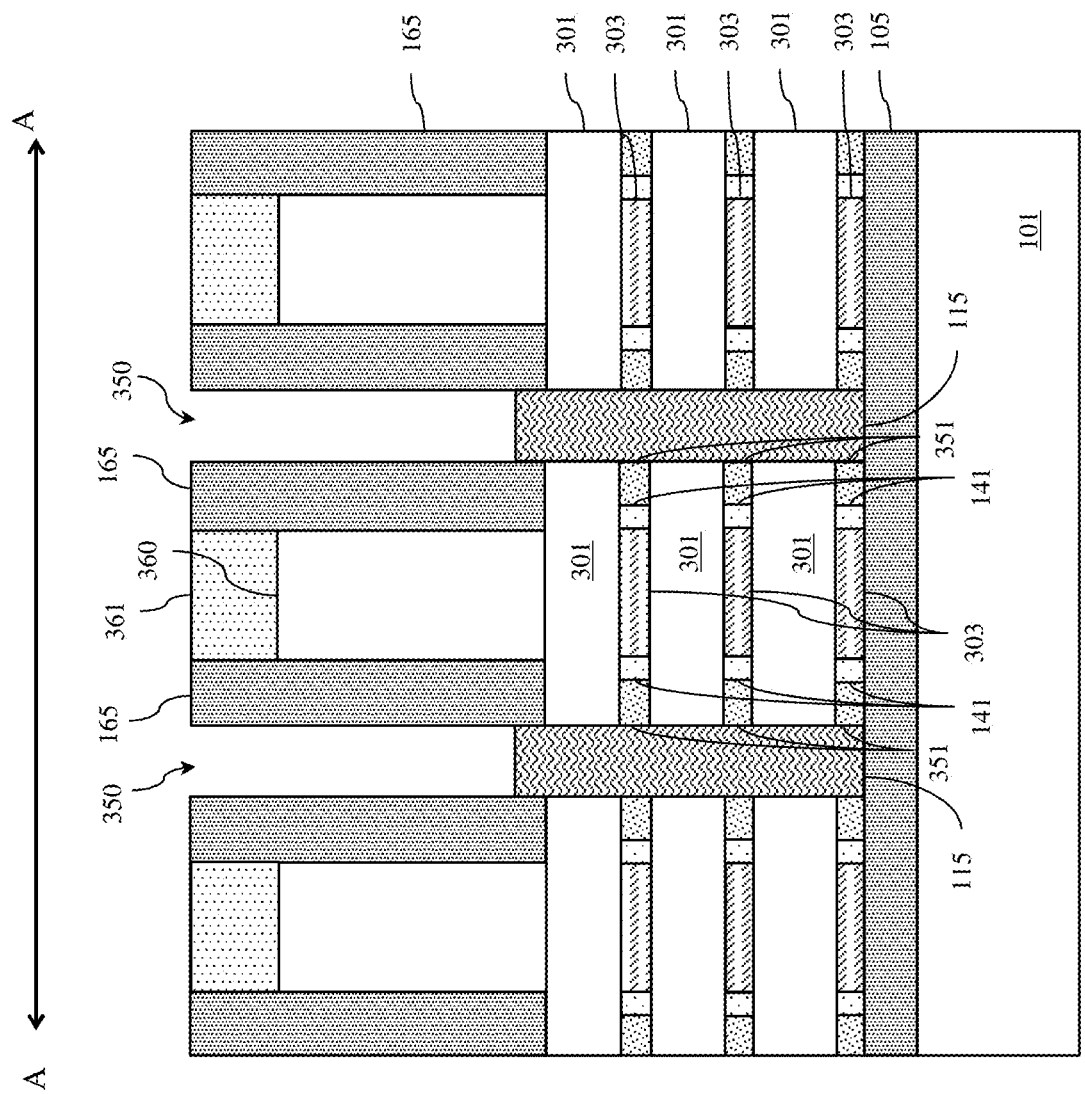
FIG. 11 is a cross-section diagram illustrating a partially completed structure formed according to the flow diagram of FIG. 2.

Source/drain regions 115 can subsequently be formed on the isolation layer 105 in the source/drain recesses 350 (see process step 222 and FIG. 11). The source/drain regions 115 can be formed, for example, by epitaxially growing a monocrystalline semiconductor material on the exposed vertical surfaces the first semiconductor material within the source/drain recesses 350. This semiconductor material for the source/drain regions can be the first semiconductor material (e.g., monocrystalline silicon (Si)) or some other suitable monocrystalline semiconductor material, which is preselected, for example, to improve channel mobility depending upon the conductivity type of GAAFET being formed. Additionally, the source/drain regions 115 can be in situ doped, during epitaxial deposition, so as to have a suitable conductivity type and level given the conductivity type of the GAAFET being formed. For example, for a P-type GAAFET, the source/drain regions 115 can be in situ doped so as to have P-type conductivity at a relatively high conductivity level (i.e., P+ conductivity). For an N-type GAAFET, the source/drain regions 115 can be in situ doped so as to have N-type conductivity at a relatively high conductivity level (i.e., N+ conductivity). Additionally, an anneal process can be performed so as to drive some of the dopant material from the source/drain regions 115 into the exposed ends of the layers of the first semiconductor material 301, thereby doping the source/drain extension regions. As a result, for a P-type GAAFET, the source/drain extensions regions will have P-type conductivity at a relatively low conductivity level (i.e., P− conductivity). For an N-type GAAFET, the source/drain extension regions will have N-type conductivity at a relatively low conductivity level (i.e., N− conductivity).

Figure 12:
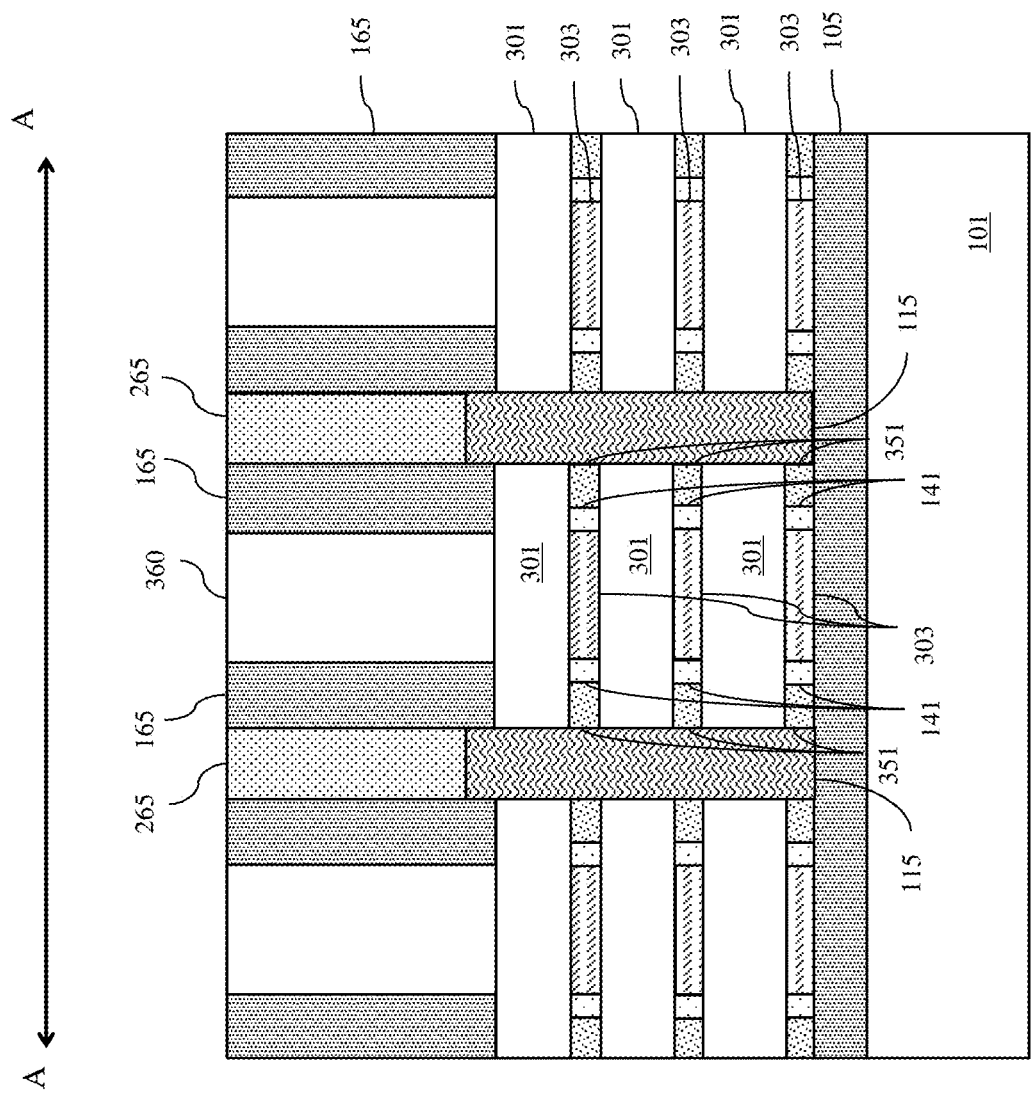
FIG. 12 is a cross-section diagram illustrating a partially completed structure formed according to the flow diagram of FIG. 2.
Figure 13A:
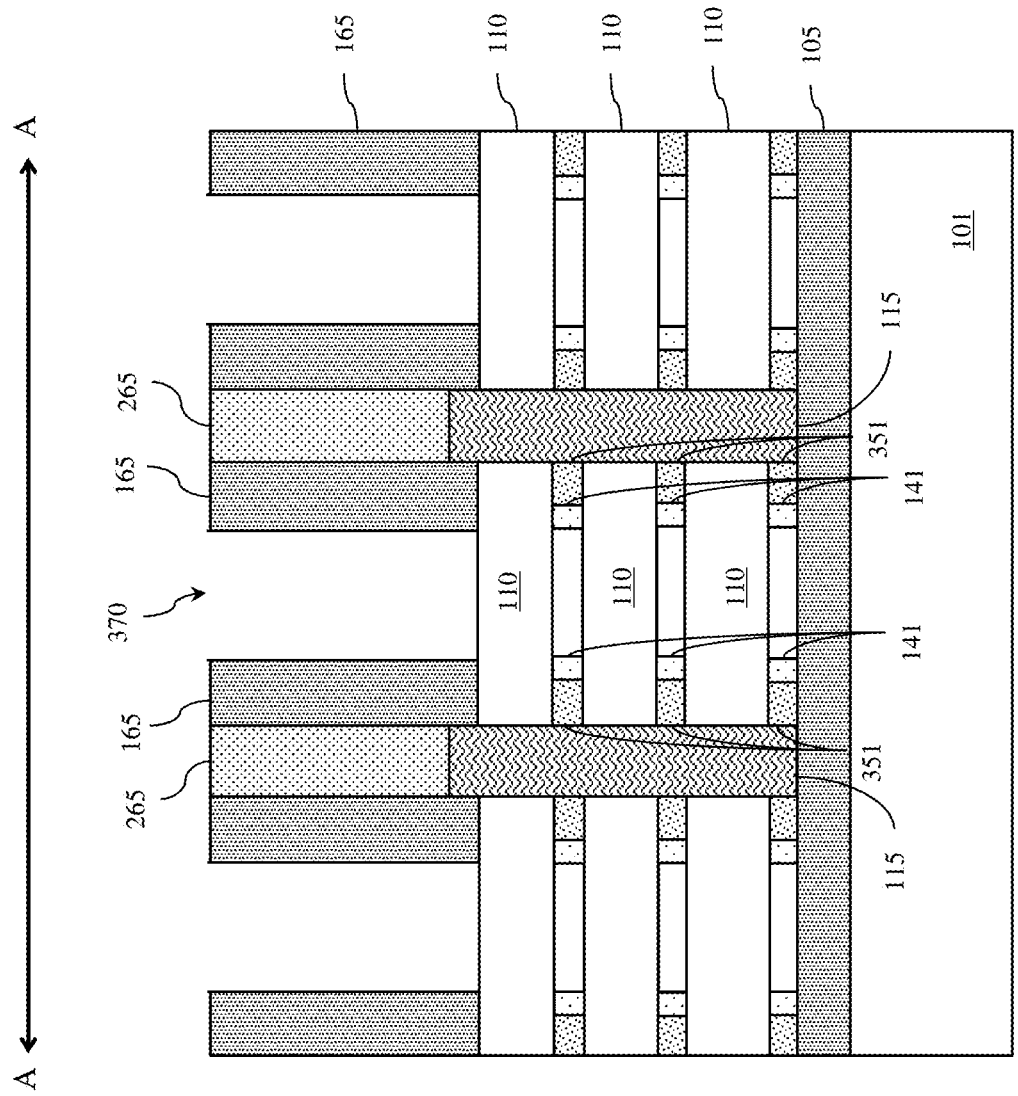
Figure 15A:
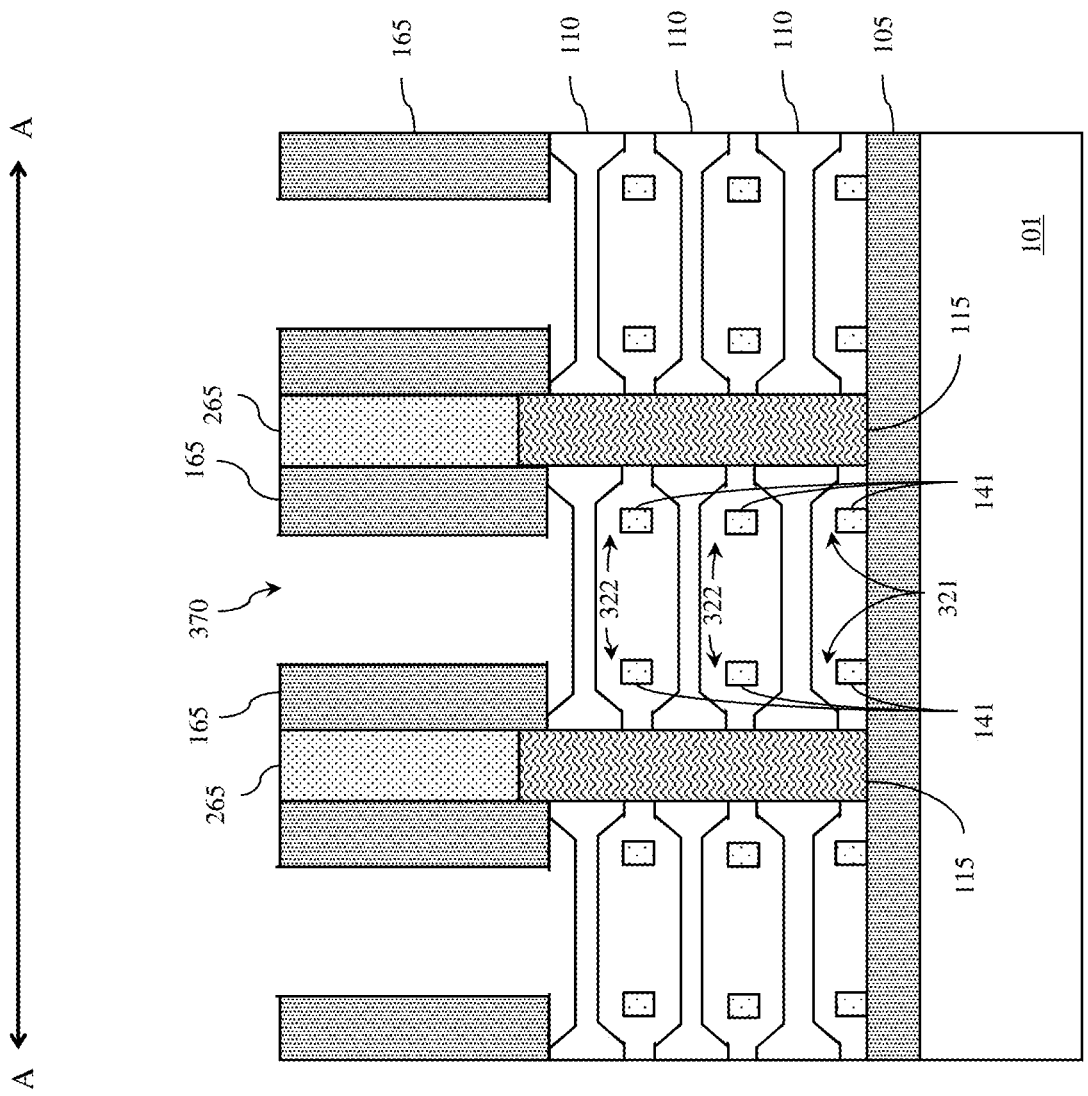
Figure 16A:
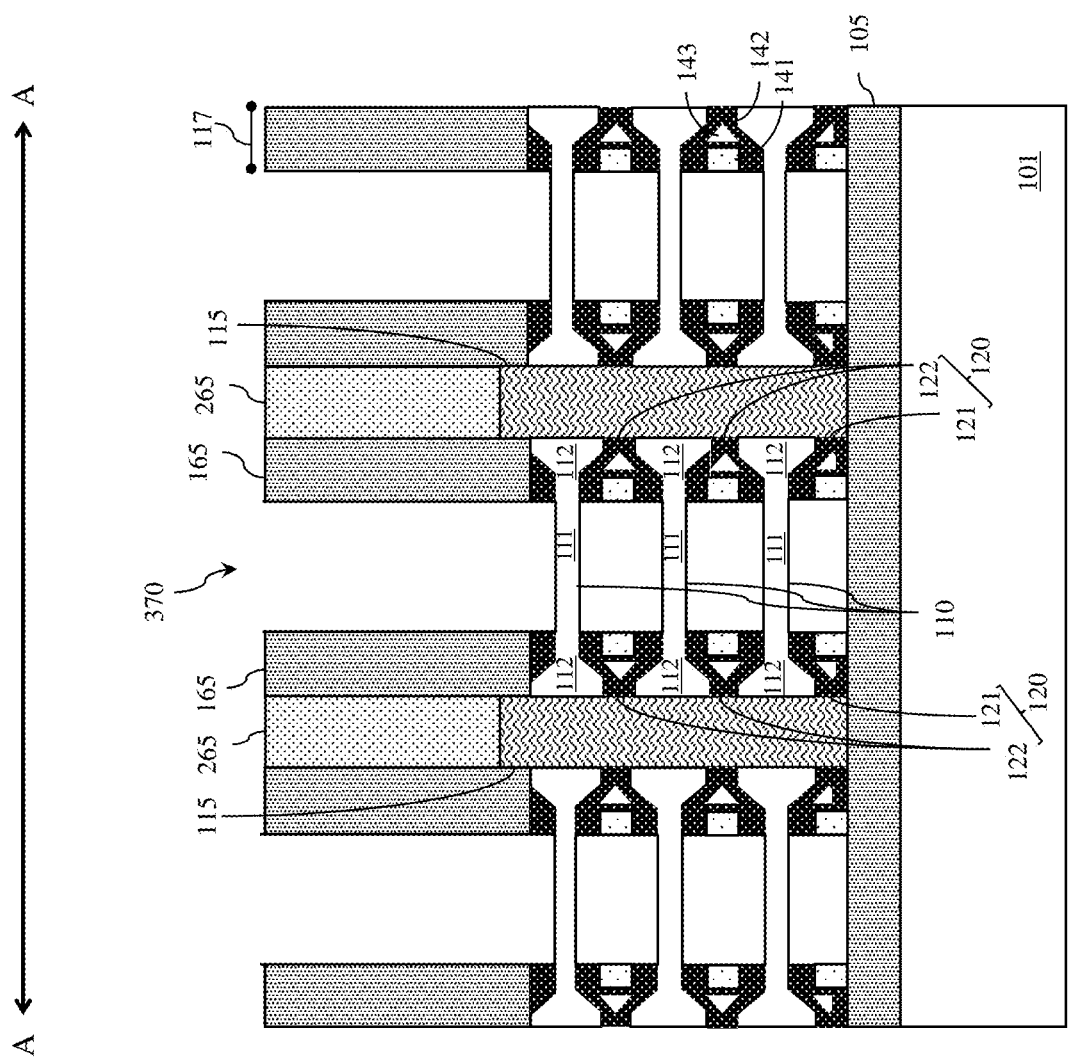

A blanket layer of interlayer dielectric (ILD) material (e.g., silicon dioxide ($SiO_2$) or any other suitable ILD material that is different from the dielectric materials of the gate sidewall spacer 165) can be deposited so as to fill the open space above the source/drain regions 115 (e.g., between gate sidewall spacers 165 on adjacent sacrificial gates) (see process step 224 and FIG. 12). The ILD material can then be polished (e.g., using a chemical mechanical polishing (CMP) process) to expose the sacrificial gate 360.

The sacrificial gate 360 can then be selectively removed, thereby creating a gate opening 370 (see process step 226). That is, a selective etch process can be performed to selectively etch away the material of the sacrificial gate layer over the semiconductor materials of the semiconductor body 310 (i.e., over the first semiconductor material 301 and the third semiconductor material 303) and also over the dielectric materials of the gate sidewall spacer 165 and ILD, thereby creating a gate opening 370. As mentioned above, formation of the sacrificial gate 360 typically includes deposition of a thin conformal dielectric layer (e.g., a thin conformal silicon dioxide layer) prior to deposition and patterning of the sacrificial gate material. This thin conformal dielectric layer will protect the semiconductor materials during removal of the sacrificial gate 360. Following removal of the sacrificial gate 360, this conformal dielectric layer can also be removed from the gate opening 370 (e.g., by buffered hydrofluoric acid (BHF) in the case of a silicon dioxide layer).

Exposed third semiconductor material 303 of the semiconductor body 310 within the gate opening 370 can then be selectively etched away (see process step 228 and FIGS. 13A-13D). For example, if the first semiconductor material 301 is silicon (Si) and the third semiconductor material 303 is silicon germanium (e.g., SiGe25%), then the SiGe can be selectively etched over the Si as well as the dielectric materials of the gate sidewall spacers 165 using any of the following exemplary processes: a hydrogen chloride (HCl) or chlorine trifluoride ($ClF_3$) vapor phase etch process, a dry plasma etch process, or a wet etch process with process specifications designed to ensure the selective etch of silicon germanium over silicon and various dielectric materials. Alternatively, any other suitable isotropic selective etch process that selectively etches silicon germanium could be used.

Following removal of the third semiconductor material 303, the remaining layers of the first semiconductor material 301 will be distinct semiconductor nanosheets 110.

These nanosheets 110 extend laterally between the source/drain regions 115 and are stacked vertically. The lowermost nanosheet is above, parallel to, and physically separated from the isolation layer 105. One or more additional nanosheets are stacked one above the other such that they are physically separated from and parallel to each other. The number of nanosheets will depend upon the number of layers of the first semiconductor material 301 previously formed at process step 204. In any case, each nanosheet 110 has end portions 112 and a center portion 111. The end portions 112 of each nanosheet 110 are positioned laterally immediately adjacent to the source/drain regions 115, previously doped to be source/drain extension regions, and are aligned with the gate sidewall spacers 165 and temporary spacers such that they are not exposed within the gate opening 370. The center portion 111 of each nanosheet 110 is positioned laterally between the end portions 112 and top, side and bottom surfaces are exposed within the gate opening 370. Additionally, the first spacer layers 141 of each of the temporary spacers will be exposed within the gate opening 370 below the interfaces between the center portion 111 and end portions 112 of each nanosheet 110. At this stage in the method, each nanosheet 110 can have an essentially uniform thickness.

In conventional GAAFET processing, a replacement metal gate (RMG) is typically formed in the gate opening once the nanosheets are formed. In the disclosed embodiments, before the RMG is formed, the nanosheets 110 are first thinned in order to expose the sacrificial spacer layers 351 of the temporary spacers (see process step 230 and FIGS. 14A-14D). For example, exposed surfaces of the first semiconductor material 301 within the gate opening can be oxidized in a controlled fashion so that the oxidation depth can be selectively controlled. Then, a chemical oxide removal (COR) process can be performed to remove the oxide material from the remaining first semiconductor material, thereby effectively thinning the nanosheets 110 by some selectively controlled amount. For example, if the thickness of each nanosheet is 13 nm, the oxidation process can be performed so as to oxidize the exposed surfaces of the first semiconductor material 301 to a depth of approximately 4 nm and, thus, the final thickness of the center portion 111 of each nanosheet will be approximately 5 nm. It should be noted that the temporary spacers will protect the end portions 112 of the nanosheets 110 when this thinning process is first initiated such that those end portions only begin to be etched and the sacrificial spacer layers of the temporary spacers below only begin to be exposed toward the end of the thinning process. As a result, following the thinning process, the end portions 112 of each nanosheet 110 will be essentially tapered with each nanosheet 110 having a maximum nanosheet thickness 113 at the source/drain regions 115 and a minimum nanosheet thickness 114 that is less than the maximum nanosheet thickness 113 near the center portion 111 and further across the center portion 111.

Once exposed, the sacrificial spacer layers 351 can be selectively removed (see process step 232 and FIGS. 15A-15D), thereby forming inner spacer cavities 322. Each inner spacer cavity 322 will have a closed distal end defined by a source/drain region surface and an open proximal end, which is adjacent to the gate opening 370 and which is opposite and taller than the closed distal end. It should be noted that the first spacer layers 141 of the temporary spacers will remain intact during removal of the sacrificial spacer layers 351 such that they traverse the open proximal ends of the inner spacer cavities 322, respectively. Removal of the sacrificial spacer layers 351 can be accomplished through the use of an isotropic etch process suitable for removing the material of the sacrificial spacer layers over the other exposed materials including the materials of the first spacer layers 141, the nanosheets 110, the gate sidewall spacers 165, etc.

The method can further include conformally depositing another dielectric spacer material and then etching back this dielectric spacer material to create inner spacers 120 within each of the inner spacer cavities 322 (see process steps 224-226 and FIGS. 16A-16D). Specifically, at process step 224, a dielectric spacer material can be conformally deposited into the gate opening 370 and further into the inner spacer cavities 322 through the open proximal ends above and, if applicable, below the first spacer layer 141. This dielectric spacer material can be the same material used for the first spacer layers 141 (e.g., silicon nitride (SiN). Alternatively, the dielectric spacer material could be a different dielectric spacer material than that used for the first spacer layers 141. For example, this dielectric spacer material could be some low-K dielectric material, which is also different from the dielectric materials of the interlayer dielectric (ILD) layer(s), the gate sidewall spacers 165, and the isolation layer 105. Thus, for example, if the ILD material is silicon dioxide (SiO$_2$) and the isolation layer 105 and gate sidewall spacers 165 are made of silicon boron carbonitride (SiBCN), silicon oxycarbonitride (SiOCN), or silicon carbonitride (SiCN), then this dielectric spacer material could be silicon oxycarbide (SiOC). It should be understood that the exemplary combination of materials mentioned above is not intended to be limiting and that alternative combinations could be employed. For example, if ILD material is silicon dioxide (SiO$_2$) and the isolation layer 105 and gate sidewall spacers 165 are made of silicon boron carbonitride (SiBCN), then this dielectric spacer material could be silicon oxycarbide (SiOC), silicon oxycarbonitride (SiOCN), or silicon carbonitride (SiCN) and so on.

In any case, once the dielectric spacer material is deposited, it can be selectively and isotropically etched (see process step 236). This etch process can be performed so as to remove any excess dielectric spacer material from the gate opening 370 (e.g., to re-expose the center portions 111 of each of the nanosheets 110) and so as to leave a second spacer layer 142 (i.e., a remaining portion of the dielectric spacer material) within each inner spacer cavity 322, thereby completing the formation of inner spacers 120 within the inner spacer cavities 322.

As discussed above with regard to the structure embodiments, first or lowermost inner spacers 121, which extend vertically between the isolation layer 105 and the end portions 112 of the lowermost nanosheet 110, will have a slightly different structure, than the inner spacers 120 include first inner spacers 121 and second inner spacers 122, which extend vertically between end portions 112 of adjacent nanosheets 110. This is because the first spacer layer 141 of the first inner spacers 121 is immediately adjacent to the isolation layer so that the dielectric spacer material that forms the second spacer layer 142 in these inner spacers 121 is only deposited into the corresponding inner spacer cavities through an opening above those first spacer layers 141; whereas the dielectric spacer material is deposited into the upper inner spacer cavities from openings both above and below the first spacer layer 141.

In any case, the second spacer layer 142 in each inner spacer 120 will extend laterally from the proximal end adjacent to the gate opening 370 beyond first spacer layer 141 toward or to the adjacent source/drain region 115 at the closed distal end. Depending upon the dimensions of the inner spacer cavities in which these inner spacers 120 are formed (including the size of the openings into the cavities) and further depending on the thickness of the dielectric spacer material that is conformally deposited into the cavities to form the second spacer layers 142 at process step 234, the dielectric spacer material may pinch-off within the openings to the cavities before those cavities are completely filled and the resulting inner spacers 120 will be air-gap inner spacers. That is, each inner spacer 120 will include the first spacer layer 141 and the second spacer layer 142 (as discussed above) and will also include an air-gap 143 positioned laterally somewhere between the first spacer layer 141 and the adjacent source/drain region 115.

For example, if, at process step 234, the dielectric spacer material is conformally deposited into the inner spacer cavities 322 such that it covers the internal surfaces of those cavities but pinches off at the openings to the cavities (i.e., above and, if applicable, below the first spacer layer 141) before those cavities are completely filled, then the resulting inner spacers 120 will each include an air-gap 143 that is fully encapsulated by the second spacer layer 142 in an area between the first spacer layer 141 and the adjacent source/drain region 115 (e.g., as shown in FIGS. 16A-16D). However, given possible variations in the dimensions of the inner spacer cavities and/or possible variations in the thickness of the conformally deposited dielectric spacer material, the inner spacers 120 may have an air-gap 143, but the resulting second spacer layer 142 may not cover all surfaces within the inner spacer cavity, may not completely encompass the air-gap 143 and/or may not extend across the full length of the inner spacer to the adjacent source/drain region 115. Alternatively, given possible variations in the dimensions of the inner spacer cavities and/or possible variations in the thickness of the conformally deposited dielectric spacer material, the dielectric spacer material may completely fill the inner spacer cavities 322 such that the resulting inner spacers 120 are devoid of any air-gaps.

Next, a gate 160 can be formed in the gate opening 370 above and immediately adjacent to the isolation layer 105 and further wrapping around (i.e., adjacent to the top, bottom and side surfaces) of the center portion 111 of each nanosheet 110 (see process step 238 and FIGS. 1A-1E). The resulting gate 160 will have an external portion 163 that extends horizontally across the width of the device above and immediately adjacent to the center portion 111 of the uppermost nanosheet and will further extend vertically along opposing sides of the device. The resulting gate 160 will also have a first internal portion 161, which extends vertically from the isolation layer 105 to the center portion 111 of the lowermost nanosheet and which extends laterally between a pair of first inner spacers 121, and second internal portion(s) 162, which extend vertically between the center portions 111 of adjacent nanosheets 110 and which extend laterally between corresponding pairs of second inner spacers 122. The gate 160 can be formed at process step 238 using conventional replacement metal gate (RMG) formation techniques. That is, a gate dielectric layer (e.g., a high-K gate dielectric layer) can be conformally deposited so that the exposed surfaces of the nanosheets within gate opening are covered. Then, one or more gate conductor layers (e.g., one or more conformal work function metal layer, a fill metal layer, etc.) can be deposited on the gate dielectric layer. Various different RMG processing techniques are well known in the art and, thus, the details have been omitted from this specification in order to allow the reader to focus on the salient aspects of the disclosed method.

A dielectric gate cap 169 can also be formed on the gate 160. For example, the conductive fill material within the gate opening can be recessed (i.e., etched back) and a dielectric cap layer (e.g., a silicon nitride (SiN) cap layer) can be deposited over the partially completed structure. A polishing process (e.g., a CMP process) can be performed so as to remove any of the dielectric cap material from above the top surface of the ILD material 265 and gate sidewall spacers 165, thereby forming the dielectric gate cap 169.

Additional processing can be performed in order to complete the semiconductor structure. This additional processing can include, but is not limited to, formation of metal plugs 198 on the source/drain regions 115, formation of middle of the line (MOL) contacts, formation of back end of the line (BEOL) wiring, etc.

As mentioned above, with device size scaling and, particularly, as gate pitch decreases with each new technology node, prior art techniques for forming the inner spacers for GAAFETs in the walls of the source/drain recesses before source/drain region formation by depositing dielectric spacer material into the narrow open space between adjacent gates suffer from dielectric spacer material pinch-off, which makes removing the excess dielectric spacer material from the source/drain recesses difficult. The method embodiments disclosed herein avoid this problem by forming relatively small (short) temporary spacers (including a first spacer layer 141 and a sacrificial spacer layer 351) in temporary spacer cavities 355 in the walls of the source/drain recesses 350 before source/drain region 115 formation. Additional inner spacer processing is subsequently performed through the gate opening 370, which is created by sacrificial gate removal. This additional inner spacer processing replaces the short temporary inner spacers with larger (taller) inner spacers 120 (which retain the first spacer layer 141). Deposition of a relatively thick layer of the dielectric spacer material into the gate opening to fill relatively large inner spacer cavities with a second spacer layer 142 can be performed without suffering pinch-off in the gate opening 370 because the gate opening 370 is typically significantly larger than the opening between adjacent gates. An additional advantage of the disclosed method is the potential for the formation of air-gaps 143 within the inner spacers 120 to further reduce parasitic gate-to-source/drain capacitance.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor comprising:
   source/drain regions;
   a semiconductor nanosheets extending laterally between the source/drain regions, wherein the nanosheet has end portions immediately adjacent to the source/drain regions, respectively, and a center portion positioned laterally between the end portions;
   a gate wrapped around the center portion of the nanosheet; and
   inner spacers,
   wherein each inner spacer is positioned laterally between the gate and an adjacent source/drain region, wherein each inner spacer comprises:
a first spacer layer immediately adjacent to a surface of the gate; and
a second spacer layer immediately adjacent to the surface of the gate at least above the first spacer layer and further extending laterally beyond the first spacer layer to the adjacent source/drain region,
wherein each inner spacer has a first spacer section adjacent to the gate and a second spacer section adjacent to the adjacent source/drain region, and
wherein the first spacer section comprises the first spacer layer and the second spacer layer and has a maximum spacer thickness and the second spacer section comprises the second spacer layer only and has a minimum spacer thickness that is less than the maximum spacer thickness.

2. The transistor of claim 1,
wherein each inner spacer has a third spacer section positioned laterally between the first spacer section and the second spacer section,
wherein the third spacer section is tapered, and
wherein each end portion of each nanosheet has a minimum nanosheet thickness above the first spacer section, has a maximum nanosheet thickness that is greater than the minimum nanosheet thickness above the second spacer section and is tapered above the third spacer section.

3. The transistor of claim 1, wherein, within the nanosheet, the end portions are wider than the center portion.

4. The transistor of claim 1, wherein, within each inner spacer, the first spacer layer and the second spacer layer comprise different dielectric spacer materials such that each inner spacer is a hybrid inner spacer.

5. The transistor of claim 1, wherein, within each inner spacer, the first spacer layer and the second spacer layer comprise a same dielectric spacer material.

6. The transistor of claim 2, wherein, within each inner spacer, the third spacer section comprises the second spacer layer and an air-gap encapsulated by the second spacer layer.

7. The transistor of claim 1, wherein, within each nanosheet, the center portion comprises a channel region and the end portions comprise source/drain extension regions.

8. A transistor comprising:
source/drain regions;
semiconductor nanosheets extending laterally between the source/drain regions,
wherein the nanosheets are stacked vertically and physically separated, and
wherein each nanosheet has end portions immediately adjacent to the source/drain regions, respectively, and a center portion positioned laterally between the end portions;
a gate wrapped around the center portion of each nanosheet such that internal portions of the gate are aligned below each center portion; and
inner spacers, wherein each inner spacer is positioned laterally between an internal portion of the gate and an adjacent source/drain region and comprises:
a first spacer layer immediately adjacent to a surface of the internal portion;
a second spacer layer immediately adjacent to the surface of the internal portion at least above the first spacer layer and further extending laterally beyond the first spacer layer to the adjacent source/drain region; and
an air-gap encapsulated by the second spacer layer and positioned laterally between the first spacer layer and the adjacent source/drain region.

9. The transistor of claim 8,
wherein each inner spacer has a first spacer section adjacent to the gate, a second spacer section adjacent to the adjacent source/drain region and a third spacer section positioned laterally between the first spacer section and the second spacer section,
wherein the first spacer section comprises the first spacer layer and the second spacer layer and has a maximum spacer thickness, the second spacer section comprises the second spacer layer only and has a minimum spacer thickness that is less than the maximum spacer thickness, and the third spacer section comprises the second spacer layer and the air-gap encapsulated by the second spacer layer and is tapered, and
wherein each end portion of each nanosheet has a minimum nanosheet thickness above the first spacer section, has a maximum nanosheet thickness that is greater than the minimum nanosheet thickness above the second spacer section and is tapered above the third spacer section.

10. The transistor of claim 8, wherein, within each nanosheet, the end portions are wider than the center portion.

11. The transistor of claim 8, wherein, within each inner spacer, the first spacer layer and the second spacer layer comprise different dielectric spacer materials such that each inner spacer is a hybrid inner spacer.

12. The transistor of claim 8, wherein, within each inner spacer, the first spacer layer and the second spacer layer comprise a same dielectric spacer material.

13. The transistor of claim 8,
wherein the internal portions of the gate comprise:
a first internal portion that extends vertically between an isolation layer and a lowermost nanosheet and first inner spacers adjacent to the first internal portion; and
at least one second internal portion that extends vertically between adjacent nanosheets and second inner spacers adjacent to each second internal portion,
wherein, within each first inner spacer, the first spacer layer is above and immediately adjacent to the isolation layer and the second spacer layer only contacts the first internal portion of the gate above the first spacer layer,
wherein, within each second inner spacer, the second spacer layer contacts a second internal portion of the gate both above and below the first spacer layer,
wherein the transistor further comprises gate sidewall spacers on external sidewalls of the gate, and
wherein the gate sidewall spacers have essentially a same length as the end portions and the inner spacers.

14. The transistor of claim 8, wherein, within each nanosheet, the center portion comprises a channel region and the end portions comprise source/drain extension regions.

* * * * *